US006110640A

United States Patent [19]
Kawamura et al.

[11] Patent Number: 6,110,640
[45] Date of Patent: Aug. 29, 2000

[54] PHOTOSENSITIVE COMPOSITION

[75] Inventors: Koichi Kawamura; Noriaki Watanabe, both of Shizuoka, Japan

[73] Assignee: Fuji Photo Film Co., Ltd., Minami Ashigara, Japan

[21] Appl. No.: 08/969,763

[22] Filed: Nov. 13, 1997

[30] Foreign Application Priority Data

| | | | |
|---|---|---|---|
| Nov. 14, 1996 | [JP] | Japan | 8-303354 |
| Nov. 27, 1996 | [JP] | Japan | 8-316517 |
| Dec. 24, 1996 | [JP] | Japan | 8-343740 |
| Dec. 26, 1996 | [JP] | Japan | 8-348526 |

[51] Int. Cl.[7] .............................. G03C 1/52; G03F 7/039; G03F 7/021; G03F 7/023

[52] U.S. Cl. ........................ 430/270.1; 430/906; 430/910; 526/251; 524/544

[58] Field of Search ................................ 430/270.1, 906, 430/910; 526/251; 524/544

[56] References Cited

U.S. PATENT DOCUMENTS

| | | | |
|---|---|---|---|
| 2,566,162 | 8/1951 | Caldwell et al. | 260/79.3 |
| 2,642,416 | 6/1953 | Ahlbrecht et al. | 260/83.5 |
| 4,791,166 | 12/1988 | Saukaitis | 524/544 |
| 4,822,713 | 4/1989 | Nishioka et al. | 430/175 |
| 5,085,975 | 2/1992 | Mueller et al. | 430/285 |
| 5,670,299 | 9/1997 | Urano et al. | 430/326 |

FOREIGN PATENT DOCUMENTS

| | | |
|---|---|---|
| 0 230 995 | 8/1987 | European Pat. Off. . |
| 0 412 765 | 2/1991 | European Pat. Off. . |
| 0 843 218 | 5/1998 | European Pat. Off. . |
| 8-15858 | 1/1996 | Japan . |

*Primary Examiner*—Cynthia Hamilton
*Assistant Examiner*—Barbara Gilmore
*Attorney, Agent, or Firm*—Burns, Doane, Swecker & Mathis, LLP

[57] ABSTRACT

A positive working photosensitive composition comprising a specific fluorine-containing copolymer. The positive working photosensitive composition has not only an ability to form a high contrast image but also an ability to inhibit halation, a satisfactory safe light tolerance and a wide development latitude, without lowering the sensitivity.

3 Claims, No Drawings

PHOTOSENSITIVE COMPOSITION

FIELD OF THE INVENTION

The present invention relates to a positive working photosensitive composition suit able for the production of lithographic plates, IC circuits or photomasks and, more particularly, to a positive working photosensitive composition which has a high sensitivity, a high contrast image-forming ability, an ability to inhibit halation, a sufficient safe light tolerance and an excellent development latitude. In more detail, the present invention relates to a positive working photosensitive composition having not only a high contrast image-forming ability but also improved ability to inhibit halation and safe light tolerance, and wide development latitude, the composition being prepared without lowering the sensitivity by adding a particular compound into a composition having a high sensitivity prepared by a known method.

BACKGROUND OF THE INVENTION

A photosensitive composition comprising an o-quinonediazide compound has been used industrially as a very excellent positive working photosensitive composition in the production of a lithographic printing plate or as a photoresist. For increasing the sensitivity of the positive working photosensitive composition comprising an o-quinonediazide compound, various proposals have been hitherto made. However, it is yet unsuccessful to provide a composition having not only a high contrast image-forming ability but also satisfactory performance in halation, safe light tolerance and development latitude, without lowering the sensitivity.

For instance, the reduction in the content of an o-quinonediazide compound increases the sensitivity, but lowers the contrast of an image and causes deterioration in halation, safe light tolerance and development latitude. Similarly, the use of the combination of an o-quinonediazide compound and a binder having high solubility in an alkali increases the sensitivity, but results in an image having low contrast and deterioration in halation, safe light tolerance, and development latitude.

On the other hand, chemically amplified photosensitive materials having an alkali-soluble group protected by an acid decomposable group has been proposed as a system having a higher sensitivity than o-quinonediazide compounds, e.g., in U.S. Pat. No. 4,491,628 and European Patent 0,249,139, and have been used prevailingly. However, these materials are still unsatisfactory as to the image contrast and the development latitude.

The term "soft" used for the image contrast means that, when a coating of photosensitive composition is exposed through a step wedge and then developed, there is a great difference between the step number at which an image begins to remain and the step number at which the coating remains entirely. Conversely, the term "hard" used for the image contrast means that there is a small difference between the step number at which an image begins to remain and the step number at which the coating remains entirely.

The terminology "halation" as used herein means that the nitrogen produced by the decomposition of a quinonediazide compound lifts the lith film out of the substrate and thereby it is made impossible to subject the lith film to perfect contact exposure; as a result, a halation (under cutting) is generated. In general, under a condition that the photosensitive compositions have the same clear sensitivity, the generation of such a halation can be prevented more easily in a composition which provides an image having a higher contrast.

The terminology "safe light tolerance" as used herein means that the image sensitivity of a printing plate is insusceptible to the influence of exposure to white light, such as light of a fluorescent lamp, and the safe light tolerance becomes better the higher the image contrast is. This tendency is attributable to a partial decomposition of a quinonediazide compound under white light. As far as a printing plate can provide a high contrast image, the image is not eluted even when a small amount of quinonediazide compound is decomposed, so that the printing plate forms a similar image whether or not it has undergone the exposure to white light.

The terminology "step wedge" as used herein refers to the strip-form film having the density changed stepwise by 0.15 for each step. The step wedge is used for examining the relationship between the amount of exposure and the amount of the photosensitive layer remained after exposure and development. The term "clear sensitivity" as used herein refers to the sensitivity at which the image begins to form after exposure and development.

The terminology "development latitude" as used herein means the measure of a variation caused in image sensitivity by the change in concentration of a developer used after exposure. The smaller the variation in sensitivity is, the better the development latitude is.

Further, the technique of increasing the sensitivity by adding a light-insensitive compound to a photosensitive composition comprising an o-quinonediazide compound has been proposed, but has various drawbacks.

For instance, the addition of cyclic acid anhydrides for increasing the sensitivity is proposed in JP-A-52-80022 (the term "JP-A" as used herein means an "unexamined published Japanese patent application"). This method actually has a sensitivity increasing effect, but the addition of such an acid anhydride in a sufficient amount to provide a considerably increased sensitivity lowers the image contrast and causes marked deterioration in safe light tolerance and development latitude. In addition, it is proposed in JP-A-55-73045 to add a hydroxybenzophenone-formaldehyde condensation product for the purpose of increasing the sensitivity. This proposal also has the same drawbacks as the proposal by JP-A-52-80022. Namely, when the condensation product is added in a sufficient amount to increase the sensitivity to a considerable extent, the image contrast is lowered and safe light tolerance and development latitude are deteriorated seriously.

With the intention of solving the aforementioned problems, some methods of adding surfactants have been proposed. For instance, JP-A-59-121044 discloses the method of widening the development latitude by the addition of an amphoteric surfactant and an organic boron-containing surfactant to a highly sensitized positive working photosensitive composition, and JP-A-62-251740 discloses the method of widening the development latitude by the addition of a nonionic surfactant to a highly sensitized positive working photosensitive composition. However, each of those methods can bring about some improving effect upon development latitude, but the effect is not satisfactory. The increase of the amount of such a surfactant to attain a sufficient effect causes a drop in the sensitivity. On the other hand, those methods have no effect of improving the halation and safe light tolerance.

Furthermore, the fluorine-containing polymers having a fluoroaliphatic group and a polyoxyalkylene group are described as surfactants in JP-A-62-226143, JP-A-3-172849 and JP-A-8-15858. However, the use of those polymers can not provide improvement in halation and safe light tolerance.

SUMMARY OF THE INVENTION

Therefore, an object of the present invention is to solve the problems of the prior art, and thereby to provide a positive working photosensitive composition which has not only an ability to form a high contrast image but also an ability to inhibit halation, satisfactory safe light tolerance and wide development latitude, without lowering the sensitivity.

As a result of our intensive studies, it has been found that the above-described object can be attained by the addition of a particular fluorine-containing polymer to a positive working photosensitive composition.

More specifically, it has been found that the addition of each of the three types of fluorine-containing copolymers as specified below to a positive working photosensitive composition enables the photosensitive composition to have not only an ability to form a high contrast image but also an ability to inhibit the halation from generating, satisfactory safe light tolerance and wide development latitude, without lowering the sensitivity. The present invention is particular effective in imparting high contrast to positive working photosensitive materials highly sensitized by conventional methods, and the addition of a particular fluorine-containing copolymer according to the present invention can change the image from low contrast to high contrast, and improve the halation, the safe light tolerance and the development latitude.

The first fluorine-containing polymer according to the present invention is a copolymer having at least the following components (1), (2) and (3) as copolymerization components:

(1) an addition polymerizable monomer having a fluoroaliphatic group, (2) an acrylate, methacrylate, acrylamide or methacrylamide, each having an aliphatic group having at least 9 carbon atoms or an aromatic group substituted by an aliphatic group containing at least two carbon atoms, and (3) an addition polymerizable monomer which has an acidic group in which the acidic hydrogen atom is bonded to a nitrogen atom, or a monomer having a phenolic hydroxyl group represented by the following formula [1], [2] or [3];

$CH_2{=}CA[CO{-}NR_1{-}(X)_m{-}Y{-}(OH)_n]$ [1]

$CH_2{=}CA[CO{-}O{-}(X)_m{-}Y{-}(OH)_n]$ [2]

$CH_2{=}CA[Z{-}(X){-}Y{-}(OH)_n]$ [3]

wherein A represents a hydrogen atom, a halogen atom or an alkyl group having 1 to 4 carbon atoms; $R_1$ represents a hydrogen atom, an alkyl group having 1 to 20 carbon atoms or an aryl group having 6 to 20 carbon atoms; Y and Z, which may be the same or different, each represents an arylene group having 6 to 20 carbon atoms; X is a divalent organic linkage group composed of atoms selected from carbon, nitrogen, oxygen, sulfur, halogen and hydrogen atoms; m is an integer of 0 or 1; and n is an integer of 1 to 3.

Although a clear account is not given of the mechanism by which the effects of the present invention are produced, an outline of the mechanism can be assumed to consist in that a fluorine-containing copolymer according to the present invention can float on the photosensitive layer surface by virtue of fluoroaliphatic groups coming from the component (1), the lipophilic groups coming from the component (2) retard the penetration of a developer into the photosensitive layer surface, and particular groups coming from the component (3), though they do not function as acid before exposure because of their interaction with a photosensitive compound such as an o-quinonediazide compound, come to function as acid through exposure since the exposure quenches the interaction between those groups and the photosensitive compound, thereby changing the surface properties of the photosensitive layer.

The second fluorine-containing polymer according to the present invention is a copolymer having as constitutional repeating units at least the following components (1) and (2):

(1) an addition polymerizable monomer having a fluoroaliphatic group, and (2) a monomer having a constitutional unit represented by the following formula [2-1], [2-2] or [2-3];

$CH_2{=}CA[(B)_m{-}CONH{-}SO_2R^1]$ [2-1]

$CH_2{=}CA[(B)_m{-}SO_2{-}NH{-}Y]$ [2-2]

[2-3]

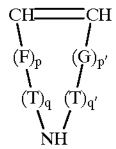

wherein A represents a hydrogen atom, a halogen atom or an alkyl group; B represents an arylene group; m is 0 or 1; $R^1$ represents an alkyl group or an aryl group; Y represents a hydrogen atom, an alkyl group, an aryl group, —CO—$R^2$ or —$SO_2$—$R^2$; $R^2$ represents an alkyl group or an aryl group; or B may combine with Y or $R^1$ to form a ring composed of non-metallic atoms; F and G each represent a phenylene group or an alkylene group; T represents —O—CO—, —CO— or —$SO_2$—; p, p', q and q' each are 0 or 1, with the proviso that q and q' are not zero at the same time.

The third fluorine-containing polymer according to the present invention is a fluorine-containing polyurethane resin having the constitution described below.

More specifically, such a polyurethane resin is prepared from at least the following constitutional units (1), (2) and (3):

(1) a diol or diisocyanate having a fluoroaliphatic group, (2) a diol or diisocyanate which has a straight or branched chain, alkyl or alkylene group containing at least 10 carbon atoms or an arylene group substituted by an alkyl group containing at least 4 carbon atoms, and (3) a diol or diisocyanate having an acidic group in which the acidic hydrogen atom is bonded to a nitrogen atom.

In this embodiment also, a clear account is not given of the mechanism by which the effects of the present invention are produced, but an outline of the mechanism can be assumed to consist in that a polyurethane resin according to the present invention can float on the photosensitive layer surface by virtue of fluoroaliphatic groups coming from the constituent monomer (1), the lipophilic groups coming from the constituent monomer (2) retard the penetration of a developer into the photosensitive layer surface, and particular groups coming from the constituent monomer (3), though they do not function as acid before exposure because of their interaction with a photosensitive compound, such as an o-quinonediazide compound, come to function as acid through exposure since the exposure quenches the interaction between those groups and the photosensitive compound, thereby changing the surface properties of the photosensitive layer.

DETAILED DESCRIPTION OF THE INVENTION

First Fluorine-Containing Copolymer

The components (1), (2) and (3) which can be used for the first fluorine-containing polymer according to the present invention are described below in detail.

The fluoroaliphatic group present in component (1), in which at least one hydrogen atom which carbon atoms of an aliphatic group have is substituted by a fluorine atom, is generally a mono- or divalent saturated aliphatic group. This group may be a straight-chain, branched-chain, or cyclic form. In order to fulfill its function in attaining the object of the present invention, the fluoroaliphatic group is required to have 3 to 20, preferably 6 to 12, carbon atoms and to have at least 40% by weight, preferably at least 50% by weight, of carbon-bonded fluorine atoms. Suitable examples of such a fluoroaliphatic group include almost perfectly or sufficiently fluorinated aliphatic groups as represented by $C_nF_{2n+1}$—, wherein n is 1 or above, preferably an integer of 3 or above (which are sometimes abbreviated as "Rf groups", hereinafter).

The aliphatic group having at least 9 carbon atoms or the aromatic group substituted by an aliphatic group having at least two carbon atoms which is present in component (2) has a development inhibiting effect in the low exposure area of a photosensitive composition, particularly a printing plate; as a result, it renders an efficient service in enhancement of the contrast-increasing effect aimed at by the present invention. In heightening such a effect, the aliphatic group having at least 9 carbon atoms, preferably at least 12 carbon atoms is effective.

The aliphatic group having at least 9 carbon atoms, which is present in a component (2), is a mono- or divalent aliphatic group, and it may be any of a straight-chain, branched-chain, and cyclic form. In order to have sufficient effect on the attainment of the object of the present invention, it is desirable for such an aliphatic group to have 12 to 30, preferably 12 to 25, carbon atoms. Examples thereof include a dodecyl group, a tridecyl group, a tetradecyl group and an octadecyl group.

With respect to the aromatic group substituted by an aliphatic group having at least 2 carbon atoms, the aromatic moiety thereof has 6 to 30, preferably 6 to 20, carbon atoms, and it is desirable for the aliphatic moiety thereof to be a $C_{2-20}$, preferably $C_{4-18}$, straight-chain, branched-chain or cyclic aliphatic group.

In addition, the foregoing aliphatic group having at least 9 carbon atoms and the foregoing aromatic group substituted by an aliphatic group having at least two carbon atoms may have a substituent. Examples of such a substituent include a halogen atom, an acyl group, an acyloxy group, an acylamino group, an alkoxycarbonyl group, a cyano group and an aromatic group.

With respect to the component (3), the monomer has a phenolic hydroxyl group and is represented by the foregoing formula [1], [2] or [3], with examples including the monomers described in JP-B-52-28401 (the term "JP-B" as used herein means an "examined Japanese patent publication"), JP-B-06-58531, JP-A-63-303343, JP-A-64-21440, JP-A-64-52139, JP-B-01-116537, European Patents 167,777 and 212,439, U.S. Pat. Nos. 4,822,719, 4,853,448 and 5,068,163, JP-A-64-35436, JP-A-51-34711 and JP-A-51-36129.

The vinyl monomers, components (1), (2) and (3) are illustrated below in more detail.

For the addition polymerizable monomeric moiety in the component (1), which has a fluoroaliphatic group whose fluorine atoms are the substitutes for hydrogen atoms on carbon atoms, a vinyl monomer having a radical polymerizable unsaturated group can be used. Suitable examples of such a vinyl monomer include acrylates, methacrylates, acrylamides, methacrylamides and styrene compounds.

As examples of an acrylate and a methacrylate to which a fluoroaliphatic group is bonded, mention may be made of compounds represented by formula, Rf-R'—OOC—C(R")$=CH_2$ (wherein R' is a single bond, an alkylene group, a sulfonamidoalkylene group or a carbonamidoalkylene group, and R" is a hydrogen atom, a methyl group, a halogen atom or a perfluoroaliphatic group).

Examples of such compounds include those described in U.S. Pat. Nos. 2,803,615, 2,642,416, 2,826,564, 3,102,103, 3,282,905 and 3,304,278, JP-A-6-256289, JP-A-62-1116, JP-A-62-48772, JP-A-63-77574 and JP-A-62-36657, and further those described in *Nippon Kagaku Kaishi* (*Journal of Japanese Chemical Society*), 1985 (No. 10), pp. 1884–1888.

In addition to those fluoroaliphatic group-bonded monomers, the fluoroaliphatic group-bonded macromonomers described in *Reports Res. Lab. Asahi Glass Co., Ltd.*, vol. 34, pp. 27–34 (1984) are used to advantage.

Also, a mixture of monomers which are different from one another in the chain length of the perfluoroalkyl group present therein, as shown in the following structural formula, can be used as the foregoing fluoroaliphatic group-containing monomer:

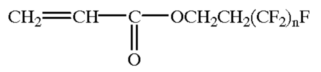

*n* = 6, 8, 10, 12

The amount of the component derived from the fluoroaliphatic group-containing vinyl monomer in the first fluorine-containing copolymer is generally from 3 to 70% by weight, preferably from 7 to 40%, by weight, based on the weight of the first fluorine-containing copolymer.

As a component (2), or a polymerizable group having an aliphatic group containing at least 9 carbon atoms or an aromatic group substituted by an aliphatic group containing at least 2 carbon atoms, an acrylate, methacrylate, acrylamide or methacrylamide is preferred. In the use of a maleimide such as N-laurylmaleimide, the polymer produced has low solubilities in organic solvents, and, in the use of an allyl ester such as an allylstearate, the allyl ester has low polymerizability and the polymer produced has poor properties.

Examples of an acrylate, a methacrylate, an acrylamide and a methacrylamide which each have an aliphatic group containing at least 9 carbon atoms or an aromatic group substituted by an aliphatic group containing at least 2 carbon atoms include the monomers recited below:

Examples of the acrylate include nonyl acrylate, decyl acrylate, lauryl acrylate, stearyl acrylate, behenyl acrylate, ethylbenzyl acrylate, n-propylbenzyl acrylate, isopropylbenzyl acrylate, n-butylbenzyl acrylate, iso-butylbenzyl acrylate, tert-butylbenzyl acrylate, ethylphenyl acrylate, n-propylphenyl acrylate, iso-propylphenyl acrylate, n-butylphenyl acrylate, iso-butylphenyl acrylate and tert-butylphenyl acrylate. Of these acrylates, lauryl acrylate, stearyl acrylate, behenyl acrylate, tert-butylbenzyl acrylate and tert-butylphenyl acrylate are preferred over the others.

Examples of the methacrylate include nonyl methacrylate, decyl methacrylate, lauryl methacrylate, stearyl methacrylate, behenyl methacrylate, ethylbenzyl methacrylate, n-propylbenzyl methacrylate, isopropylbenzyl methacrylate, n-butylbenzyl methacrylate, iso-butylbenzyl methacrylate, tert-butylbenzyl methacrylate, ethylphenyl methacrylate, n-propylphenyl methacrylate, isopropylphenyl methacrylate, n-butylphenyl methacrylate, iso-butylphenyl methacrylate and tert-butylphenyl methacrylate. Of these methacrylates, lauryl methacrylate, stearyl methacrylate, behenyl methacrylate, tert-butylbenzyl methacrylate and tert-butylphenyl methacrylate are preferred over the others.

Examples of the acrylamide and the methacrylamide include N-nonylacrylamide, N-decylacrylamide, N-laurylacrylamide, N-stearylacrylamide, N-nonylmethacrylamide, N-decylmethacrylamide, N-laurylmethacrylamide and N-stearylmethacrylamide.

Addition ally, the above-recited acrylates, methacrylates, acrylamides and methacrylamides which each have an aliphatic group containing at least 9 carbon atoms are preferable to the foregoing acrylates, methacrylates, acrylamides and methacrylamides which each have an aromatic group substituted by an aliphatic group containing at least 2 carbon atoms.

The amount of the component derived from the vinyl monomer to which is bonded an aliphatic group having at least 9 carbon atoms or an aromatic group substituted by an aliphatic group having at least 2 carbon atoms, is generally in an amount of 5 to 70% by weight, preferably 10 to 50% by weight, based on the weight of the first fluorine-containing copolymer.

With respect to the component (3) which is derived from the phenolic hydroxyl group-containing monomer represented by the following formula [1], [2] or [3], $$CH_2{=}CA[CO{-}NR_1{-}(X)_m{-}Y{-}(OH)_n] \quad [1]$$

$$CH_2{=}CA\,[CO{-}O{-}(X)_m{-}Y{-}(OH)_n] \quad [2]$$

$$CH_2{=}CA[Z{-}(X){-}Y{-}(OH)_n] \quad [3]$$

(wherein A represents a hydrogen atom, a halogen atom or an alkyl group having 1 to 4 carbon atoms; $R_1$ represents a hydrogen atom, an alkyl group having 1 to 20 carbon atoms or an aryl group having 6–20 carbon atoms; Y and Z, which may be the same or different, each represents an arylene group having 6–20 carbon atoms; X is a divalent organic linkage group composed of atoms selected from carbon, nitrogen, oxygen, sulfur, halogen and hydrogen atoms; m is an integer of 0 or 1; and n is an integer of 1 to 3); A is preferably a hydrogen atom, a halogen atom, a methyl group or an ethyl group, particularly a hydrogen atom or a methyl group, $R_1$ is preferably a hydrogen atom or an alkyl group such as a methyl or ethyl group, particularly a hydrogen atom, Y and Z each is preferably a phenylene or naphthylene group which may have a substituent, particularly an phenylene group, wherein a halogen atom such as a chlorine atom, or an alkoxy group such as a methoxy group, is favorably used as the substituent, X is preferably an alkylene group, an ester linkage, an amide linkage, a sulfonamide linkage, —OCO—, —OCON— or a combination of two or more thereof, m is 0 or 1, and n is preferably 1 or 2.

Of the monomers represented by the foregoing formulae [1], [2] and [3] respectively, the monomers of formulae [1] and [2] are preferable to the monomer of formula [3].

The amount of the component derived from such a phenolic hydroxyl group-containing monomer as represented by the foregoing formula [1], [2] or [3] in the first fluorine-containing copolymer is generally in an amount of 5 to 80% by weight, preferably 10 to 70% by weight, based on the weight of the first fluorine-containing copolymer.

Examples of structures of the phenolic hydroxyl group-containing monomers of formulae [1] to [3] used in the present invention are illustrated below:

M-1a

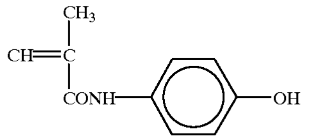

M-2a

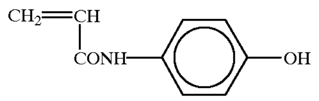

M-3a

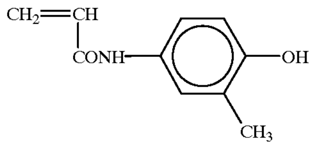

M-4a

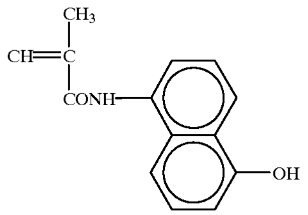

M-5a

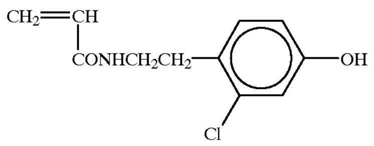

M-6a

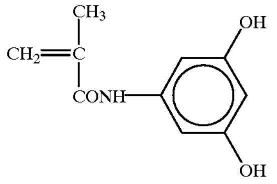

M-7a

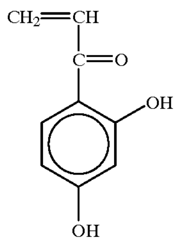

M-8a

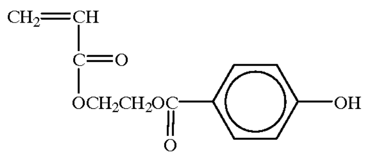

-continued

M-9a

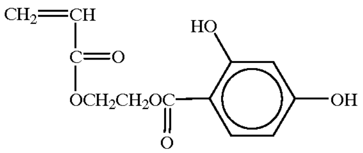

M-10a

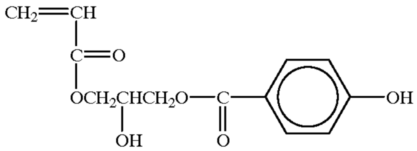

M-11a

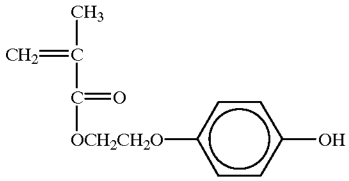

M-12a

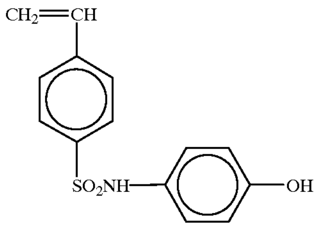

M-13a

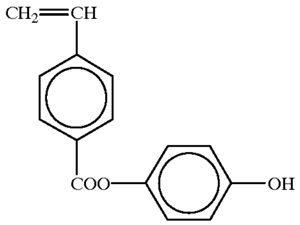

M-14a

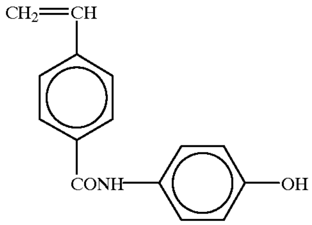

M-15a

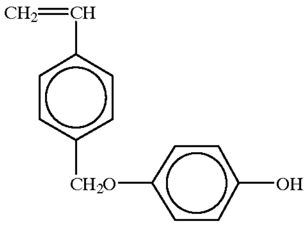

-continued

M-16a

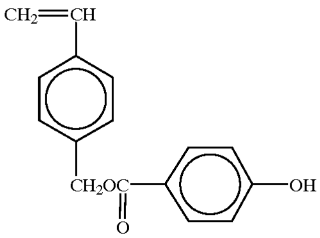

M-17a

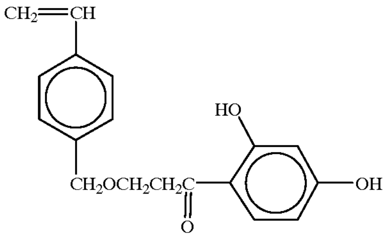

With respect to the acidic group having an acidic hydrogen atom bonded to a nitrogen atom, which is present in an addition polymerizable monomer [4] as component (3), any of acidic groups known in literatures can be used. As an example of the literature on acidic groups, mention may be made of J. A. Dean ed., *Lange's Handbook of Chemistry*, 3rd. ed., McGraw-Hill Book Co. (1985).

Examples of a partial structure of the acidic group having an acidic hydrogen atom bonded to a nitrogen atom include the groups represented by the following formulae [A] to [G] respectively:

$—SO_2NH_2$ [A]

$—SO_2NH—$ [B]

$—CONHSO_2—$ [C]

$—CONHCO—$ [D]

$—SO_2NHSO_2—$ [E]

$—CONHSO_2NH—$ [F]

$—NHCONHSO_2—$ [G]

In addition to these structures, the nitrogen-containing heterocyclic structures which constitute the couplers described in JP-A-7-248628 are also examples of a partial structure of the foregoing acidic group. Examples of such a nitrogen-containing heterocyclic structure include the structures [H] and [I] illustrated below:

[H]

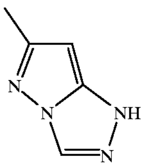

-continued

[I]

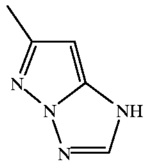

As the addition polymerizable monomeric moiety in the monomer [4] having an acidic group whose acidic hydrogen atom is bonded to a nitrogen atom, a vinyl monomer having a radical polymerizable unsaturated group can be used. Suitable examples of such a vinyl monomer include acrylates, methacrylate, acrylamides, methacrylamides and styrene compounds.

Suitable examples of a vinyl monomer having an acidic group whose acidic hydrogen atom is bonded to a nitrogen atom include the monomers having the structural unit of the following formula [4-1], [4-2] or [4-3]:

$$CH_2{=}CA[(B)_m{-}(X)_n{-}NH{-}Y] \qquad [4\text{-}1]$$

$$CH_2{=}CA[CO{-}Z{-}E{-}SO_2NH{-}R_2] \qquad [4\text{-}2]$$

(wherein A is a hydrogen atom, a halogen atom or an alkyl group having 1 to 4 carbon atoms; B is an arylene group; X is —CO— or —$SO_2$—; when X is —$SO_2$—, Y is a hydrogen atom, an alkyl group, an aryl group, —CO—$R_1$ or —$SO_2$—$R_1$, and when X is —CO—, Y is —CO—$R_1$ or —$SO_2$—$R_1$; Z is —NH—, —$NR_1$— or —O—; E is an arylene group or an alkylene group; $R_2$ is a hydrogen atom, an alkyl group or an aryl group; m and n is each 0 or 1, with the proviso that m and n are not zero at the same time; $R_1$ is an alkyl group or an aryl group; and B and Y, or E and $R_2$ may combine with each other to form a ring composed of non-metallic atoms);

[4-3]

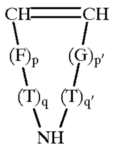

(wherein F and G each are a phenylene group or an alkylene group; T is —O—CO—, —CO— or —$SO_2$—; and p, p', q and q' each are 0 or 1, with the proviso that q and q' are not zero at the same time).

In the foregoing formulae [4-1] and [4-2], A is preferably a hydrogen atom or a methyl group. Suitable examples of the alkyl group represented by Y, $R_1$ or $R_2$ are an alkyl groups having 1 to 20 carbon atoms (e.g., methyl, ethyl and isopropyl); while suitable examples of the aryl group represented by Y, $R_1$ or $R_2$ are an aryl group having 6 to 18 carbon atoms (e.g., phenyl and naphthyl). Suitable examples of the arylene group represented by B or E include a phenylene group and a naphthylene group. Suitable examples of the alkylene group represented by E include an alkylene group having 1 to 20 carbon atoms such as methylene and ethylene.

The alkyl or aryl group represented by Y, $R_1$ or $R_2$, and the arylene or alkylene group represented by B or E each may have a substituent. Examples of the substituent include a halogen atom such as fluorine, chlorine and bromide, an alkoxy group such as methoxy and ethoxy, an aryloxy group such as phenoxy, cyano, an amido group such as an acetamido, an alkoxycarbonyl group such as ethoxycarbonyl, an alkyl group having 1 to 20 carbon atoms and an aryl group having 6 to 18 carbon atoms.

The groups preferred as F and G in the foregoing formula [4-3] include the groups recited above as suitable examples of B or E.

With respect to the foregoing monomers of formulae [4-1] to [4-3], the monomers of formulae [4-1] and [4-2] are preferable.

The amount of the component derived from the acidic group-containing monomer [4] in the first fluorine-containing copolymer is generally in an amount of 5 to 80% by weight, preferably 10 to 70% by weight, based on the weight of the copolymer.

Examples of structures of the acidic group-containing vinyl monomers of formulae [4-1] to [4-3] used in the present invention are illustrated below:

M-1b

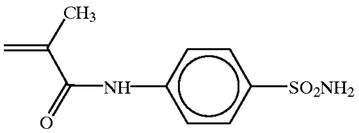

M-2b

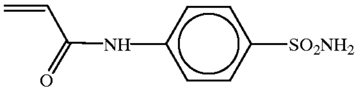

M-3b

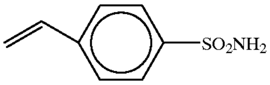

M-4b

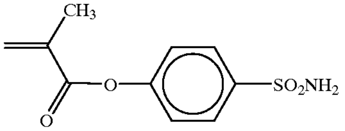

M-5b

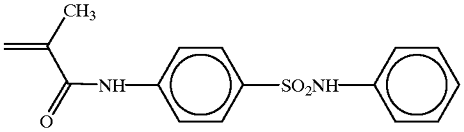

M-6b

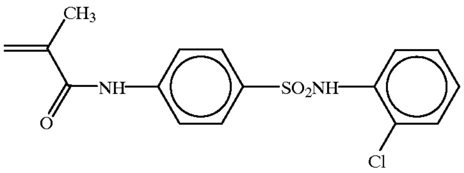

M-7b

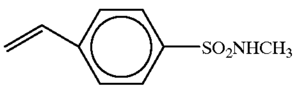

M-8b

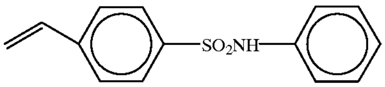

-continued
M-9b
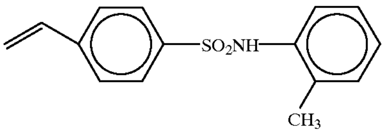
M-10b
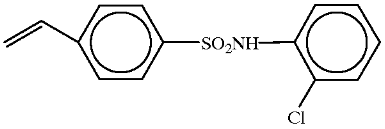
M-11b
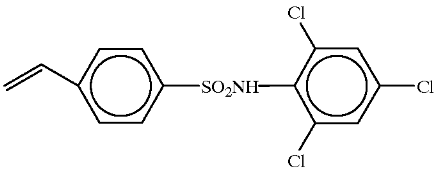
M-12b
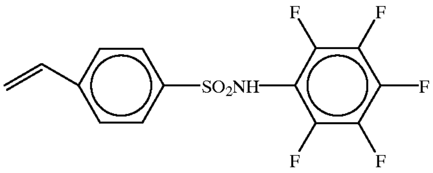
M-13b
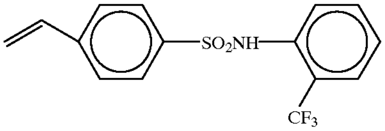
M-14b
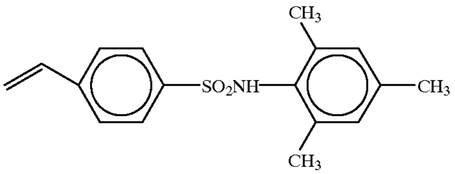
M-15b
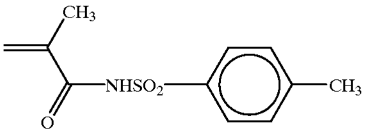
M-16b
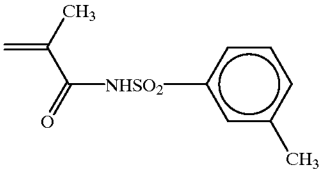
M-17b
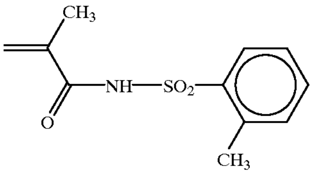
-continued
M-18b
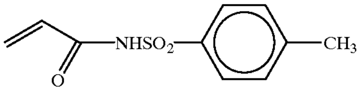
M-19b
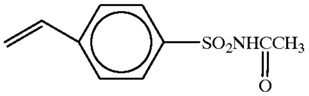
M-20b
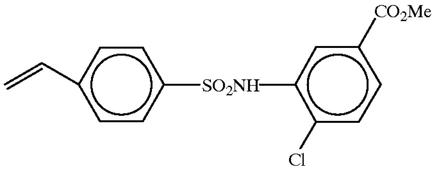
M-21b
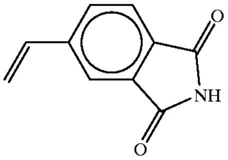
M-22b
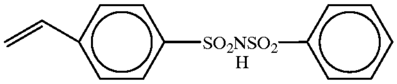
M-23b
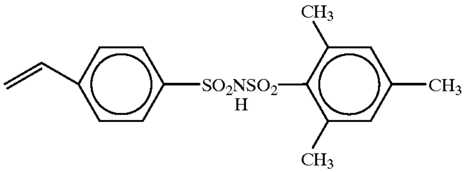
M-24b
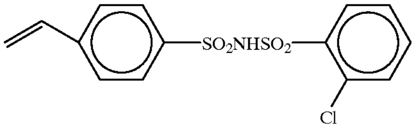
M-25b
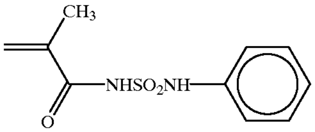
M-26b
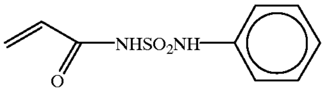
M-27b
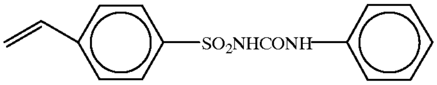
M-28b
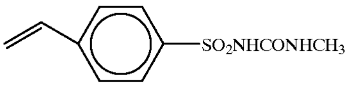

-continued

M-29b

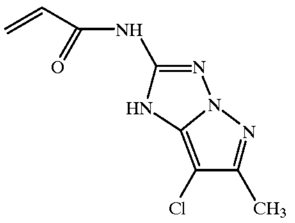

M-30b

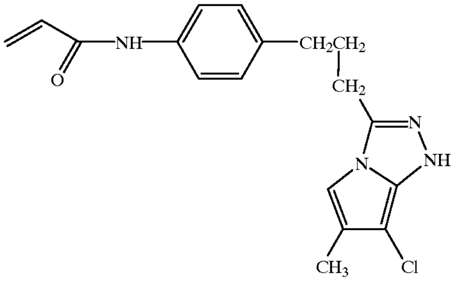

M-31b

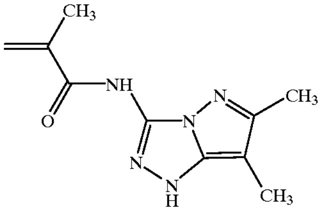

The fluorine-containing copolymer as the first copolymer according to the present invention can be synthesized using a conventional method. For instance, such a copolymer can be synthesized by thermally copolymerizing an acrylate or methacrylate having a fluoroaliphatic group, an acrylate or methacrylate having an aliphatic or aromatic group and a vinyl monomer having an acidic group whose acidic hydrogen atom is bonded to a nitrogen atom in an organic solvent by the addition of a general radical polymerization initiator. In the thermal copolymerization mentioned above, other addition polymerizable unsaturated compounds can be added, if desired.

The addition polymerizable unsaturated compound which can be added, if desired, include the monomers described in J. Brandrup, *Polymer Handbook*, 2nd ed., chapter 2, pages 1–483, Wiley Interscience (1975). As examples of such monomers, mention may be made of (meth)acrylates, such as methyl(meth)acrylate, ethyl(meth)acrylate, 2-chloroethyl (meth)acrylate, 2-hydroxyethyl(meth)acrylate and glycidyl (meth)acrylate; (meth)acrylamides, such as (meth) acrylamide, N-ethyl(meth)acrylamide, N-propyl(meth) acrylamide, N-methylol(meth)acrylamide, N,N-dimethyl (meth)acrylamide, N-hydroxyethyl (meth)acrylamide and N-(p-hydroxyphenyl)methacrylamide; allyl compounds, such as allyl acetate, allyl caproate and allyloxyethanol; vinyl ethers, such as ethyl vinyl ether, propyl vinyl ether, butyl vinyl ether, octyl vinyl ether, methoxyethyl vinyl ether, ethoxyethyl vinyl ether, 2-chloroethyl vinyl ether, hydroxyethyl vinyl ether, benzyl vinyl ether, tetrahydrofurfuryl vinyl ether, phenyl vinyl ether, tolyl vinyl ether and diethylaminoethyl vinyl ether; vinyl esters, such as vinyl acetate, vinyl butyrate, vinyl caproate, vinyl chloroacetate, vinyl methoxyacetate, vinyl phenylacetate, vinyl acetoacetate, vinyl benzoate and vinyl chlorobenzoate; styrenes, such as styrene, α-methylstyrene, methylstyrenes, dimethylstyrenes, chloromethylstyrenes, ethoxymethylstyrenes, hydroxystyrenes, chlorostyrenes and bromostyrenes; vinyl ketones, such as methyl vinyl ketone, ethyl vinyl ketone, propyl vinyl ketone and phenyl vinyl ketone; olefins, such as isobutylene, butadiene and isoprene; and other unsaturated compounds, such as butyl crotonate, dimethyl itaconate, diethyl itaconate, dimethyl maleate, diethyl fumarate, N-vinylpyrrolidone, N-vinylpyridine and acrylonitrile.

In addition to these monomers, the polyoxyalkylene (meth)acrylates described in JP-A-62-226143 and JP-A-3-172849 and the acidic group-containing monomers described in JP-A-8-15859, such as methacrylic acid and N-(p-aminosulfonylphenyl)methacrylamide, can be used.

Examples of a structure of the first fluorine-containing copolymer according to the present invention are illustrated below. Additionally, the figures in each structural formula indicate the mole fractions of constituent components corresponding thereto.

$P_1$-1

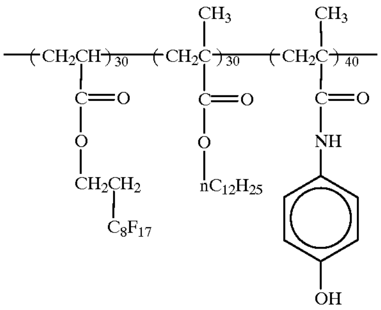

$P_1$-2

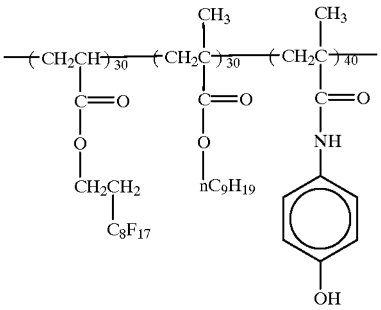

-continued
$P_1$-3
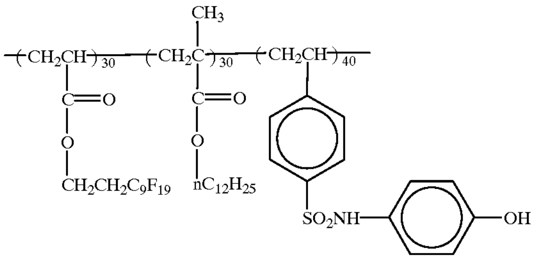
$P_1$-4
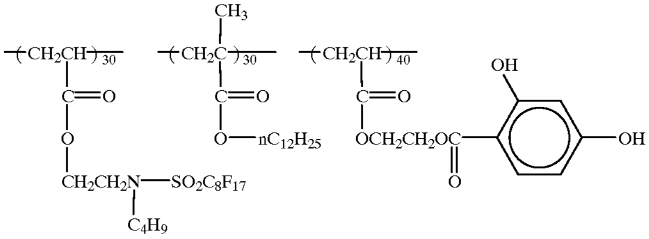
$P_1$-5
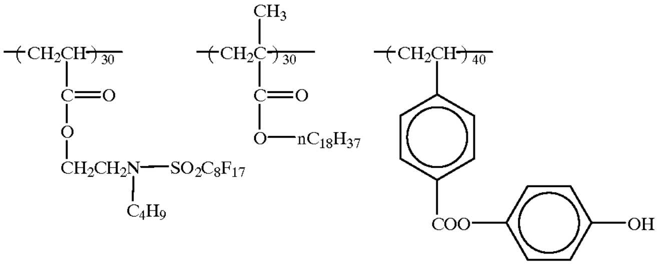
$P_1$-6
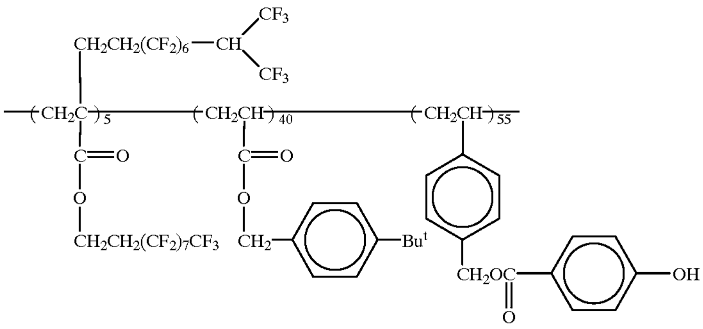
$P_1$-7
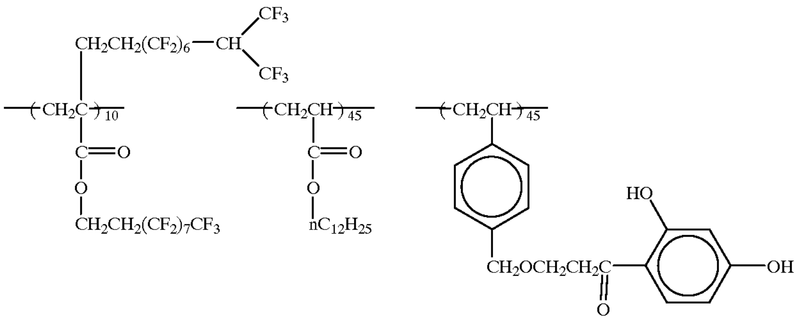

-continued
P1-8
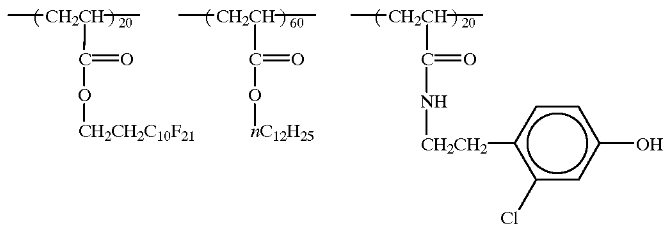
P1-9
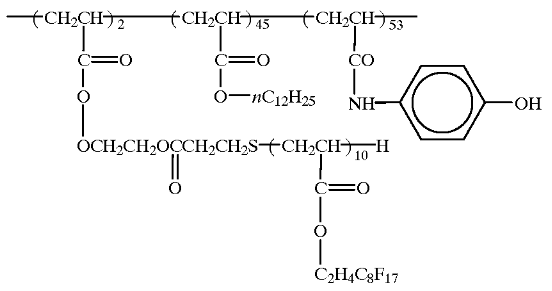
P1-10
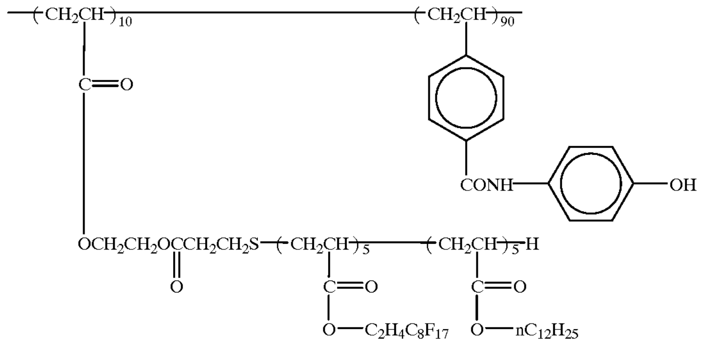
P1-11
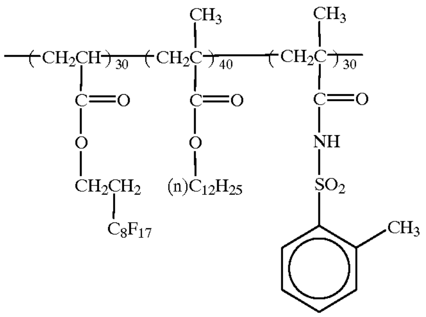
P1-12
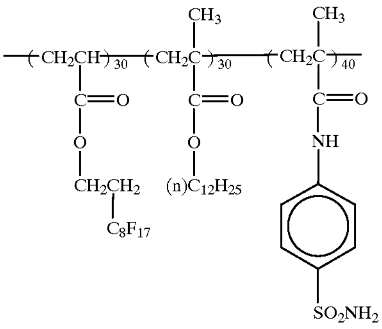
P1-13
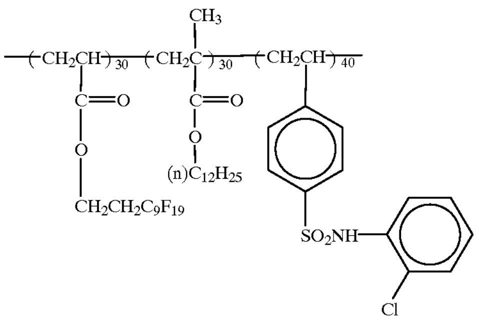
P1-14
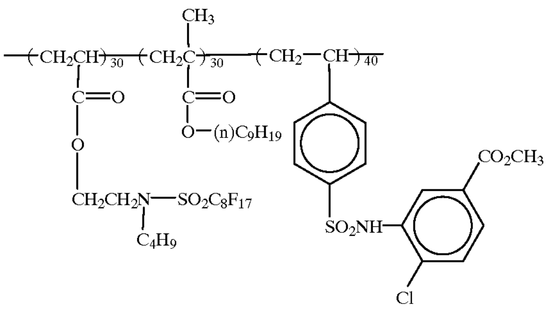

-continued
P1-15
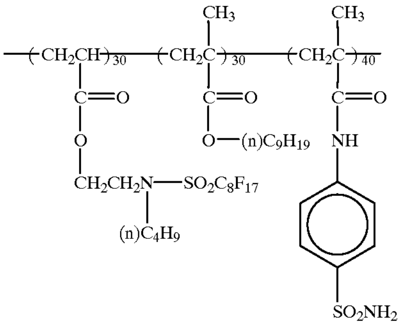
P1-16
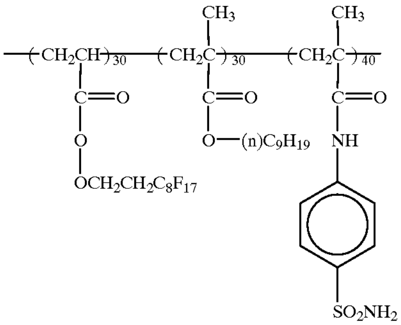
P1-17
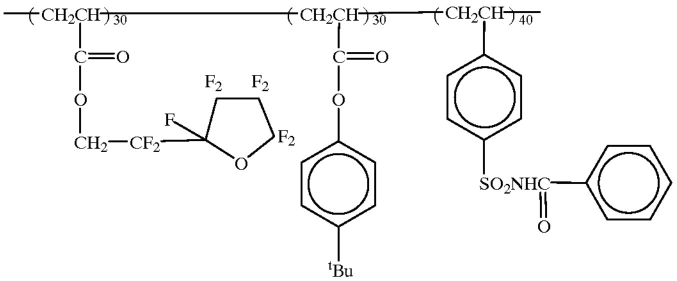
P1-18
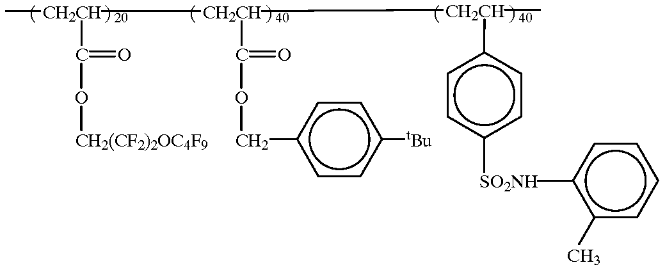
P1-19
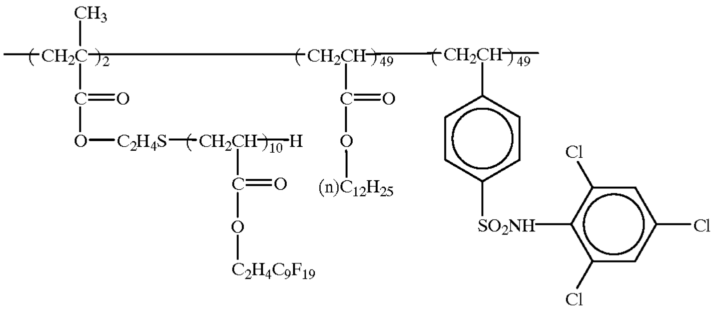
P1-20
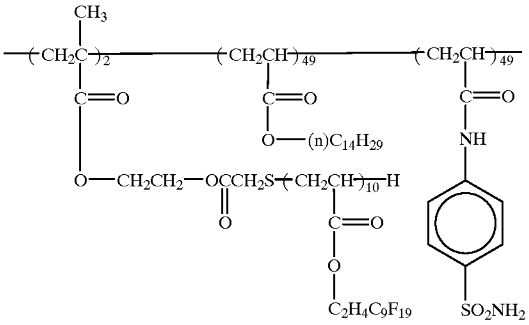

-continued

P1-21

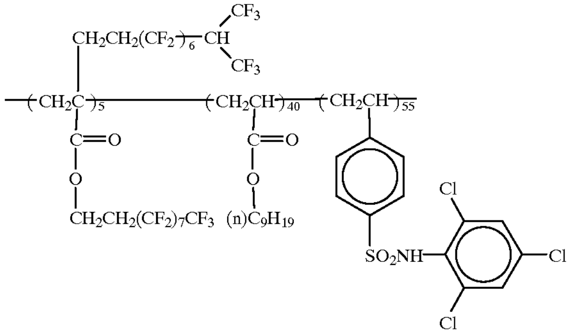

P1-22

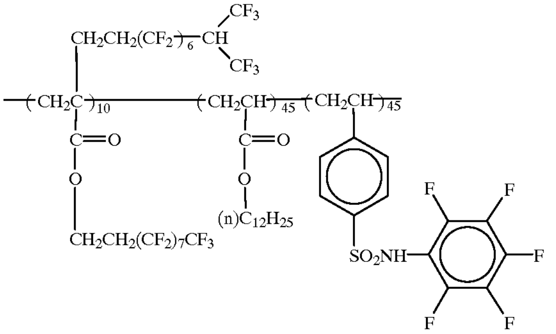

P1-23

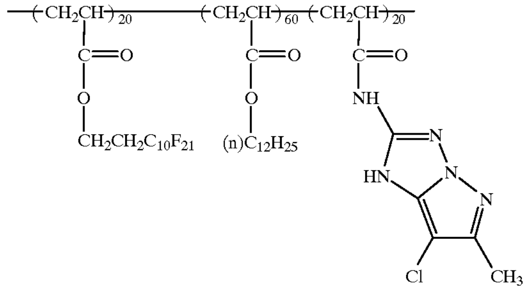

Second Fluorine-Containing Copolymer

The component (2) as one of the constitutional components of the second fluorine-containing copolymer according to the present invention is described below in detail.

The component (2) is derived from a monomer represented by the following structural formula [2-1], [2-2] or [2-3]:

$CH_2{=}CA[(B)_m{-}CONH{-}SO_2R^1]$ [2-1]

$CH_2{=}CA[(B)_m{-}SO_2{-}NH{-}Y]$ [2-2]

(wherein A is a hydrogen atom, a halogen atom or an alkyl group; B is an arylene group; m is 0 or 1; $R^1$ is an alkyl group or an aryl group; Y is a hydrogen atom, an alkyl group, an aryl group, —CO—$R^2$ or —$SO_2$—$R^2$; $R^2$ is an alkyl group or an aryl group; or B may combine with Y or $R^1$ to form a ring composed of non-metallic atoms)

[2-3]

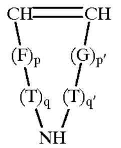

(wherein F and G each are a phenylene group or an alkylene group; T is —O—CO—, —CO— or —$SO_2$—; p, p', q and q' each are 0 or 1, provided that the case of q=q'=0 is excluded).

In the foregoing structural formulae [2-1] and [2-2], A is preferably a hydrogen atom or an alkyl group having 1 to 4 carbon atoms, particularly preferably a hydrogen atom or a methyl group. Suitable examples of the alkyl group represented by Y, $R^1$ or $R^2$ each include an alkyl group having 1 to 20 carbon atoms such as methyl, ethyl and isopropyl, and examples of the aryl group represented by Y, $R^1$ and $R^2$ each include an aryl group having 6 to 18 carbon atoms such as phenyl and naphthyl. Suitable examples of the arylene group represented by B include phenylene and naphthylene.

The alkyl group represented by Y, $R^1$ or $R^2$, the aryl group represented by Y, $R^1$ or $R^2$, and the arylene group represented by B may have a substituent. Examples of such a substituent include a halogen atom such as a fluorine, chlorine or bromine atom, an alkoxy group such as methoxy or ethoxy, an aryloxy group such as phenoxy, cyano, an amido group such as acetamido, an alkoxycarbonyl group such as ethoxycarbonyl, an alkyl group having 1 to 20 carbon atoms, and an aryl group having 6 to 18 carbon atoms.

The groups preferred as F and G in the foregoing formula [2-3] include the arylene groups recited above as suitable examples of B and an alkylene group having 1 to 20 carbon atoms such as methylene and ethylene.

The proportion of the component derived from the acidic group-containing monomer in the second fluorine-containing copolymer is generally in an amount of 5 to 80% by weight, preferably 10 to 70% by weight, based on the weight of the second fluorine-containing copolymer.

The fluoroaliphatic group-containing vinyl monomer used in combination with the foregoing acidic group-containing monomer for the synthesis of a second fluorine-containing copolymer according to the present invention has the same meaning as specified in the description of the first fluorine-containing copolymer according to the present invention, and the amount of the component derived from the vinyl monomer in the second fluorine-containing copolymer is generally from 3 to 70% by weight, preferably from 7 to 60% by weight, based on the copolymer.

With respect to the foregoing monomers of formulae [2-1] to [2-3], the monomers of formulae [2-1] and [2-2] are especially preferable.

Examples of structures of the acidic group-containing vinyl monomers of formulae [2-1] to [2-3] used in the present invention include those illustrated above as M-3b, M-7b to M-19b and M-21b to M-31b, and further M-32b illustrated below:

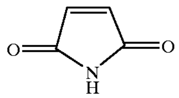

M-32b

The fluorine-containing copolymer as the second copolymer according to the present invention can be synthesized using a conventional method. For instance, such a copolymer can be synthesized by thermally copolymerizing an acrylate or methacrylate having a fluoroaliphatic group and a vinyl monomer of formula [2-1], [2-2] or [2-3] in an organic solvent by the addition of a general radical polymerization initiator. In the thermal copolymerization mentioned above, other addition polymerizable unsaturated compounds can be added, if desired.

In order to attain the object of the present invention, the second fluorine-containing copolymer is required to have as constitutional repeating units at least the components (1) and (2). Further, it is preferred that the second copolymer according to the present invention has an aliphatic or aromatic group-containing (meth)acrylate or (meth)acrylamide as an additional constitutional repeating unit.

Such an aliphatic or aromatic group-containing (meth) acrylate and (meth)acrylamide is preferably a (meth)acrylate or (meth)acrylamide each having an aliphatic group containing at least 4 carbon atoms or an aromatic group.

The aliphatic group having at least 4 carbon atoms includes a mono- and divalent aliphatic group, and it may be any of straight-chain, branched-chain or cyclic form. In order to have a greater effect on the attainment of the present object, it is desirable for such an aliphatic group to have 6 to 30, preferably 8 to 25, carbon atoms. Examples of such an aliphatic group include a n-hexyl group, a cyclohexyl group, a n-octyl group, a nonyl group, a decyl group, an undecyl group, a dodecyl group, a tridecyl group, a tetradecyl group and an octadecyl group.

For the aromatic group, it is desirable to have 6 to 30, preferably 6 to 20, carbon atoms. In particular, it is advantageous that the aromatic group be substituted by an aliphatic group having at least 1 carbon atom. Examples of the aliphatic group having at least 1 carbon atom as the substituent include a straight-chain, branched-chain, or cyclic aliphatic group having 1 to 20, preferably 4 to 18, carbon atoms, such as n-butyl, t-butyl, cyclohexyl and 2-ethylhexyl.

In addition, those aliphatic and aromatic groups may have other substituents. Examples of such substituents include a halogen atom, an acyl group, an acyloxy group, an acylamino group, an alkoxycarbonyl group, a cyan group and an aromatic group.

Examples of an acrylate, a methacrylate, an acrylamide and a methacrylamide which each have an aliphatic group containing at least 4 carbon atoms and/or an aromatic group include the monomers recited below:

Examples of the acrylate include n-butyl acrylate, isobutyl acrylate, t-butyl acrylate, pentyl acrylate, octyl acrylate, nonyl acrylate, decyl acrylate, lauryl acrylate, stearyl acrylate, behenyl acrylate, benzyl acrylate, methylbenzyl acrylate, dimethylbenzyl acrylate, chlorobenzyl acrylate, bromobenzyl acrylate, ethylbenzyl acrylate, n-propylbenzyl acrylate, iso-propylbenzyl acrylate, n-butylbenzyl acrylate, iso-butylbenzyl acrylate, tert-butylbenzyl acrylate, phenyl acrylate, naphthyl acrylate, tolyl acrylate, xylyl acrylate, chlorophenyl acrylate, bromophenyl acrylate, ethylphenyl acrylate, n-propylphenyl acrylate, iso-propylphenyl acrylate, n-butylphenyl acrylate, iso-butylphenyl acrylate and tert-butylphenyl acrylate. Of these acrylates, lauryl acrylate, stearyl acrylate, behenyl acrylate, tert-butylbenzyl acrylate, tert-butyl acrylate and tert-butylphenyl acrylate are preferred over the others.

Examples of the methacrylate include n-butyl methacrylate, iso-butyl methacrylate, tert-butyl methacrylate, pentyl methacrylate, octyl methacrylate, nonyl methacrylate, decyl methacrylate, lauryl methacrylate, stearyl methacrylate, behenyl methacrylate, benzyl methacrylate, methylbenzyl methacrylate, dimethylbenzyl methacrylate, chlorobenzyl methacrylate, bromobenzyl methacrylate, ethylbenzyl methacrylate, n-propylbenzyl methacrylate, iso-propylbenzyl methacrylate, n-butylbenzyl methacrylate, iso-butylbenzyl methacrylate, tert-butylbenzyl methacrylate, phenyl methacrylate, naphthyl methacrylate, tolyl methacrylate, xylyl methacrylate, chlorophenyl methacrylate, bromophenyl methacrylate, ethylphenyl methacrylate, n-propylphenyl methacrylate, iso-propylphenyl methacrylate, n-butylphenyl methacrylate, iso-butylphenyl methacrylate and tert-butylphenyl methacrylate. Of these methacrylates, lauryl methacrylate, stearyl methacrylate, behenyl methacrylate, tert-butyl methacrylate, tert-butylbenzyl methacrylate and tert-butylphenyl methacrylate are preferred over the others.

Examples of the acrylamide and the methacrylamide include N-nonylacrylamide, N-decylacrylamide, N-laurylacrylamide, N-stearylacrylamide, N-nonylmethacrylamide, N-decylmethacrylamide, N-laurylmethacrylamide and N-stearylmethacrylamide.

The amount of the component derived from the vinyl monomer to which an aliphatic group having at least 4 carbon atoms or an aromatic group is bonded in the second fluorine-containing copolymer is generally in an amount of 5 to 70% by weight, preferably 10 to 50% by weight, based on the copolymer.

Other addition polymerizable unsaturated compounds which can be used, if desired, include the monomers described in J. Brandrup, *Polymer Handbook*, 2nd ed., chapter 2, pages 1–483, Wiley Interscience (1975). As examples of such monomers, mention may be made of (meth)acrylates, such as methyl(meth)acrylate, ethyl(meth) acrylate, 2-chloroethyl(meth)acrylate, 2-hydroxyethyl (meth)acrylate and glycidyl(meth)acrylate; (meth) acrylamides, such as (meth)acrylamide, N-ethyl(meth) acrylamide, N-propyl(meth)acrylamide, N-methylol(meth) acrylamide, N,N-dimethyl(meth)acrylamide, N-hydroxyethyl(meth)acrylamide and N-(p-hydroxyphenyl) methacrylamide; allyl compounds, such as allyl acetate, allyl caproate, allyl stearate and allyloxyethanol; vinyl ethers, such as ethyl vinyl ether, propyl vinyl ether, butyl vinyl ether, octyl vinyl ether, methoxyethyl vinyl ether, ethoxyethyl vinyl ether, 2-chloroethyl vinyl ether, hydroxyethyl vinyl ether, benzyl vinyl ether, tetrahydrofurfuryl vinyl ether, phenyl vinyl ether, tolyl vinyl ether and diethylaminoethyl vinyl ether; vinyl esters, such as vinyl acetate, vinyl butyrate, vinyl caproate, vinyl chloroacetate, vinyl methoxyacetate, vinyl phenylacetate, vinyl acetoacetate, vinyl benzoate and vinyl chlorobenzoate; styrenes, such as styrene, α-methylstyrene, methylstyrenes, dimethylstyrenes, chloromethylstyrenes, ethoxymethylstyrenes, hydroxystyrenes, chlorostyrenes and bromostyrenes; vinyl ketones, such as methyl vinyl ketone, ethyl vinyl ketone, propyl vinyl ketone and phenyl vinyl ketone; olefines, such as isobutylene, butadiene and isoprene; and other unsaturated compounds, such as butyl crotonate, dimethyl itaconate, diethyl itaconate, dimethyl maleate, diethyl fumarate, N-vinylpyrrolidone, N-vinylpyridine and acrylonitrile.

In addition to these monomers, the polyoxyalkylene (meth)acrylates described in JP-A-62-226143 and JP-A-3-172849 can be used.

Examples of a structure of the second fluorine-containing copolymer according to the present invention are illustrated below. Additionally, the figures in each structural formula indicate the mole fractions of constituent components corresponding thereto.

$P_2$-1

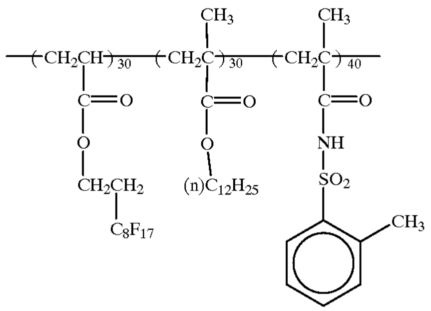

$P_2$-2

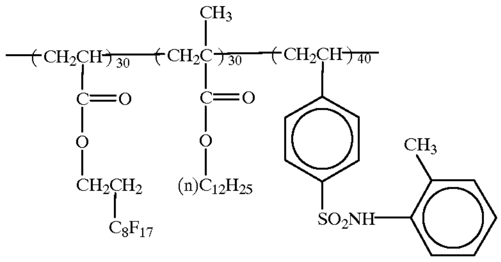

$P_2$-3

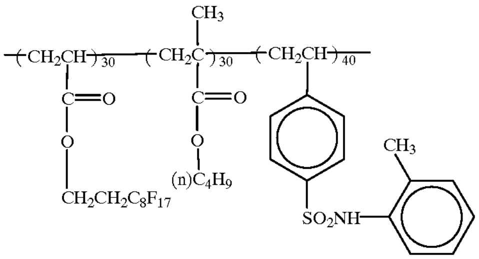

$P_2$-4

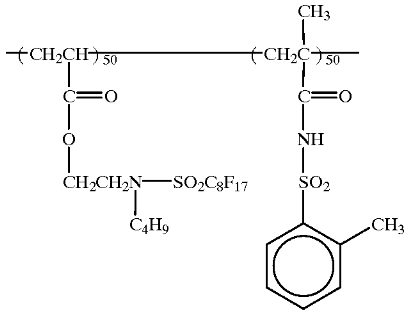

$P_2$-5

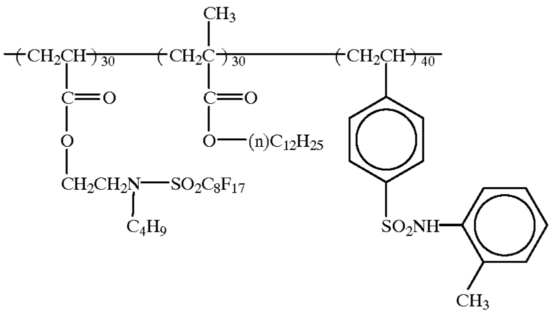

$P_2$-6

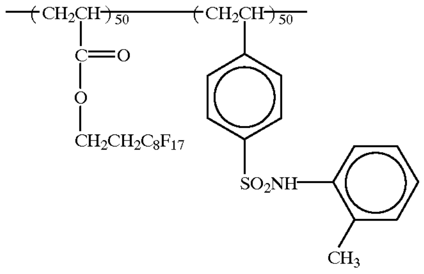

$P_2$-7

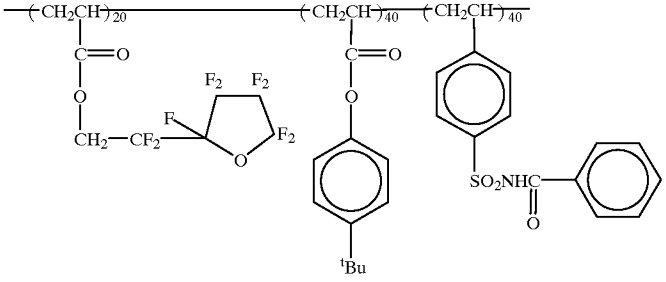

-continued
P2-8
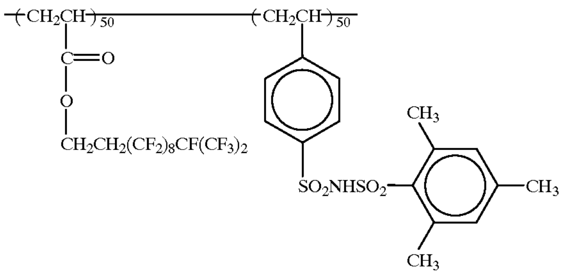
P2-9
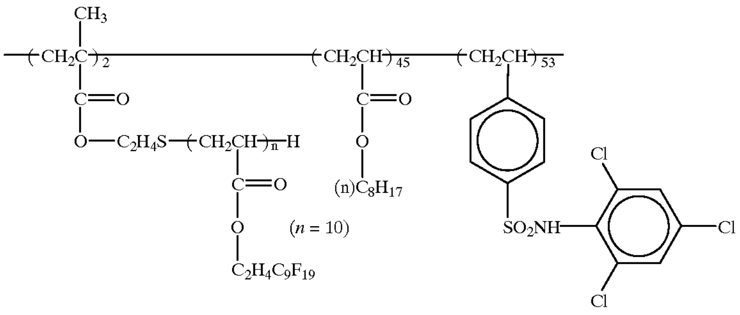
P2-10
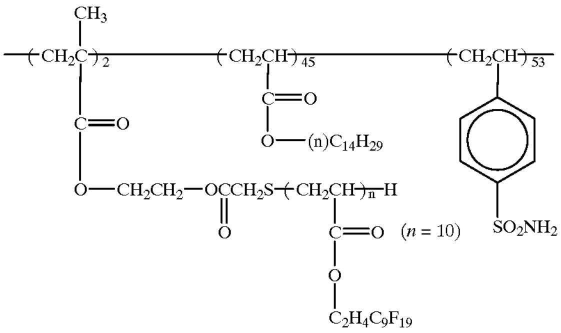
P2-11
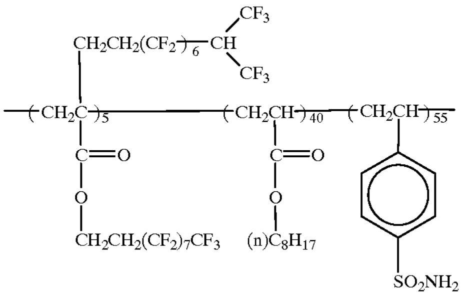
P2-12
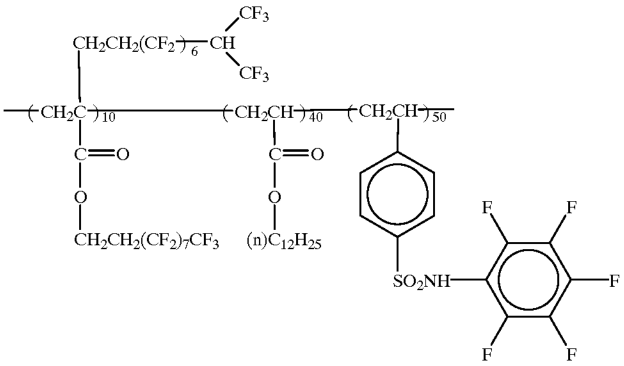
P2-13
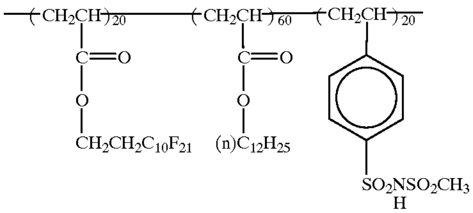

The first fluorine-containing copolymer and the second fluorine-containing copolymer, which can be used in the present invention, generally have an average molecular weight of from 3,000 to 200,000, preferably from 6,000 to 100,000. Each of the fluorine-containing copolymers according to the present invention is used in a proportion of 0.001 to 10% by weight, preferably from 0.01 to 5% by weight, to the total components (excluding a solvent) of the photosensitive composition.

Third Fluorine-Containing Copolymer

The constituent monomers (1), (2) and (3) of the third fluorine-containing copolymer of the present invention are illustrated below in detail.

The fluoroaliphatic group present in the constituent monomer (1), wherein at least one hydrogen atom which carbon atoms of an aliphatic group have is substituted by a fluorine atom, is generally a mono- or divalent saturated aliphatic group. This group may have any of straight-chain, branched-chain and cyclic forms. In order to fulfill its function in attaining the object of the present invention, the fluoroaliphatic group is required to have 3 to 20, preferably 6 to 12, carbon atoms and to have at least 40% by weight, preferably at least 50% by weight, of carbon-bonded fluorine atoms. Suitable examples of such a fluoroaliphatic group include almost perfectly or sufficiently fluorinated aliphatic groups as represented by $C_nF_{2n+1}$-, wherein n is 1 or above, preferably an integer of 3 or above (which are sometimes abbreviated as "Rf groups", hereinafter).

The straight or branched chain alkyl or alkylene group having at least 10 carbon atoms or the arylene group substituted by an alkyl group having at least 4 carbon atoms, which is present in the constituent monomer (2), has a development inhibiting effect in the low exposure area of a photosensitive composition, particularly a printing plate; as a result, it renders an efficient service in enhancement of the contrast-increasing effect aimed at by the present invention.

Of those groups, the straight or branched chain alkyl or alkylene group having at least 10 carbon atoms is particularly preferable to the arylene group substituted by an alkyl group having at least 4 carbon atoms.

The alkyl or alkylene group having at least 10 carbon atoms, which is present in the constituent monomer (2), has a straight or branched chain form, and it is undesirable for such a group to have a cyclic form. In order to have sufficient effect on the attainment of the object of the present invention, it is desirable for the alkyl or alkylene group to be a straight chain aliphatic group having 10 to 30, preferably 12 to 25, carbon atoms. Examples thereof include a decyl group, an undecyl group, a dodecyl group, a tridecyl group, a tetradecyl group and an octadecyl group.

The number of carbon atoms in the arylene moiety of an arylene group substituted by an alkyl group having at least 4 carbon atoms is from 6 to 20, preferably from 6 to 14. The alkyl group having at least 4 carbon atoms, by which the foregoing aryl group is substituted, is favorably a straight or branched chain alkyl group having 4 to 20, preferably 4 to 18, carbon atoms.

The foregoing straight or branched chain alkyl or alkylene group having at least 10 carbon atoms and the foregoing arylene group substituted by an alkyl group having at least 4 carbon atoms each are free from an acidic substituent, e.g., a group in which an acidic hydrogen atom is bonded directly to an oxygen atom, such as a carboxyl group or a phenolic hydroxyl group, or a group in which an acidic hydrogen atom is bonded directly to a nitrogen atom, such as an imido, sulfonamido or N-sulfonylamido group. Further, they are free from an anionic substituent, such as $—CO_2M$ or $—SO_3M$ (wherein M is sodium, potassium, ammonium or the like).

With respect to the acidic group having an acidic hydrogen atom bonded to a nitrogen atom, which is present in the constituent monomer (3), any of acidic groups known in literatures can be used. As an example of the literature on acidic groups, mention may be made of J. A. Dean ed., *Lange's Handbook of Chemistry*, 3rd. ed., McGraw-Hill Book Co. (1985).

Examples of a partial structure of the acidic group having an acidic hydrogen atom bonded to a nitrogen atom include the groups represented by the following formulae [A] to [G] respectively:

$—SO_2NH_2$ [A]

$—SO_2NH—$ [B]

$—CONHSO_2—$ [C]

$—CONHCO—$ [D]

$—SO_2NHSO_2—$ [E]

$—CONHSO_2NH—$ [F]

$—NHCONHSO_2—$ [G]

In addition to these structures, the nitrogen-containing heterocyclic structures which constitute the couplers described in JP-A-7-248628 are also examples of a partial structure of the foregoing acidic group. Examples of such a nitrogen-containing heterocyclic structure include the structures [H] and [I] illustrated below:

[H]

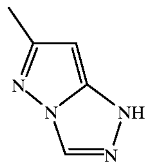

[I]

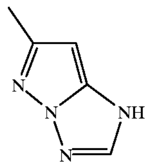

The polyurethane resin synthesized from the constituent monomers (1), (2) and (3) is characterized, is illustrated below in more detail.

The polyurethane resin can be synthesized using at least each of the constituent monomers (1), (2) and (3) of the present invention as the diol or diisocyanate component in accordance with a conventional method. In particular, it is advantageous from the viewpoint of synthesis that all of the constituent monomers (1), (2) and (3) be used as the diol component, and diisocyanate compounds other than those defined as the constituent monomers (1), (2) and (3) be used as the diisocyanate component.

Examples of a constituent monomer (1), which is a diol or diisocyanate having a fluoroaliphatic group whose fluorine atoms are the substitutes for hydrogen atoms, include the diol compounds described in JP-A-8-15858.

The amount of the component derived from the fluoroaliphatic group-containing diol compound in the fluorine-containing polyurethane resin is generally in an amount of 3 to 70% by weight, preferably 7 to 40% by weight, based on the weight of the polyurethane resin.

The diol or diisocyanate used as the constituent monomer (2), wherein is present a straight or branched chain alkyl or alkylene group having at least 10 carbon atoms or an arylene group substituted by an alkyl group having at least 4 carbon atoms, can be a diol compound having a $C_{10-30}$, preferably $C_{12-25}$, straight or branched alkylene group. Also, the constituent monomer (2) may be a diol or diisocyanate compound having an arylene group substituted by an alkyl group having at least 4 carbon atoms, the arylene moiety of which has 6 to 20, preferably 6 to 14, carbon atoms. Of such compounds, 1,10-decanediol, 1,12-dodecanediol, 1,14-tetradecanediol, t-butylbenzenediol, n-octylbenzenediol and the like are especially preferred as the constituent monomer (2).

The amount of the component derived from the foregoing diol or diisocyanate compounds in the fluorine-containing polyurethane resin is generally in an amount of 5 to 70% by weight, preferably 10 to 50% by weight, based on the weight of the polyurethane resin.

Examples of a diol having acidic group whose acidic hydrogen atom is bonded to a nitrogen atom, which is used as the constituent monomer (3), include the diol compounds represented by the following formulae [3-1], [3-2], [3-3] and [3-4] respectively:

[3-1]

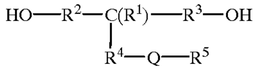

[3-2]

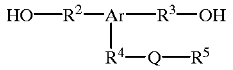

[3-3]

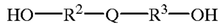

[3-4]

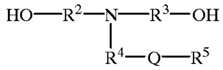

In the above formulae, $R^1$ represents a hydrogen atom, an alkyl group, an aryl group, an alkoxy group or an aryloxy group, preferably a hydrogen atom, an alkyl group having 1 to 8 carbon atoms or an aryl group having 6 to 15 carbon atoms. $R^2$, $R^3$ and $R^4$, which may be the same or different, each represents a single bond or an alkylene or arylene group which may be substituted by an alkyl group, an aryl group, an alkoxy group, a halogen atom or so on. Preferably, they are an alkylene group having 1 to 20 carbon atoms or an arylene group having 6 to 15 carbon atoms, particularly an alkylene group having 1–8 carbon atoms.

Ar is a trivalent aromatic hydrocarbon group.

$R^5$ is an alkyl or aryl group which may have a substituent such as an alkyl group, an alkoxy group or a halogen atom. Preferably, it is an alkyl group having 1 to 20 carbon atoms or an aryl group having 6 to 15 carbon atoms.

Q is $—CO—NH—SO_2—$, $—SO_2NH—$, $—NH—CO—NH—SO_2—$, $—CO—NH—SO_2—NH—$, $—O—CO—NH—SO_2—$, $—CO—NH—CO—$ or $—SO_2NHSO_2—$.

The amount of the component derived from the foregoing diol or diisocyanate compounds, which each have an acidic group whose acidic hydrogen atom is bonded to a nitrogen atom, in the fluorine-containing polyurethane resin is generally in an amount of 5 to 80% by weight, preferably 10 to 70% by weight, based on the weight of the polyurethane resin.

Examples of a diol having an acidic group whose acidic hydrogen atom is bonded to a nitrogen atom are illustrated below.

UM-1

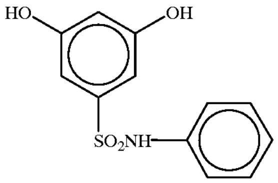

UM-2

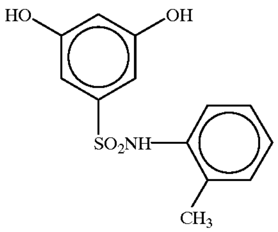

UM-3

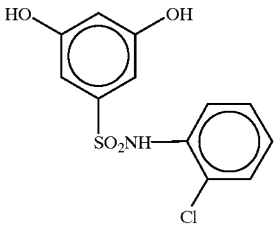

UM-4

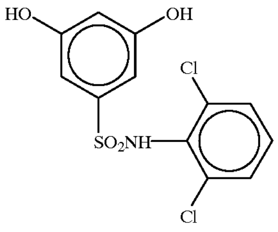

UM-5

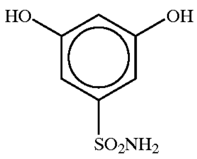

UM-6

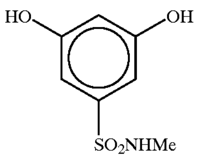

UM-7

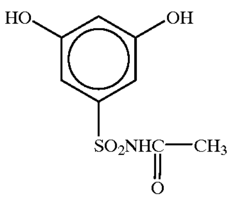

-continued

UM-8

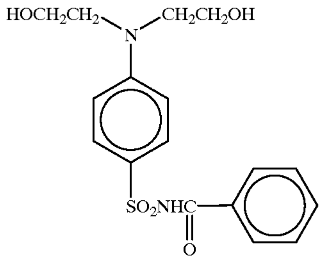

UM-9

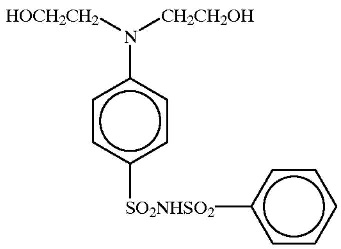

UM-10

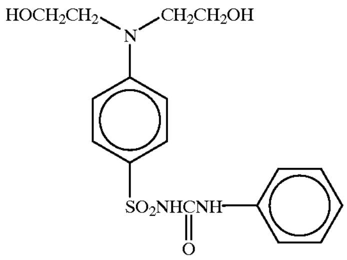

UM-11

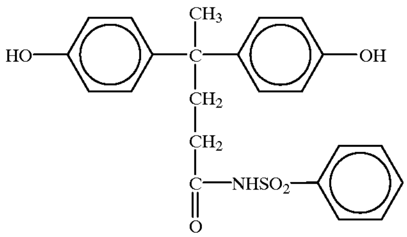

UM-12

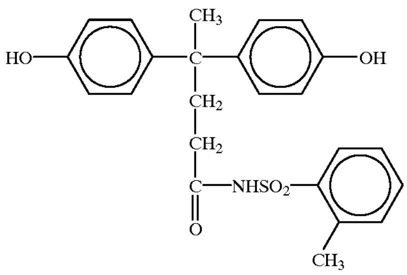

UM-13

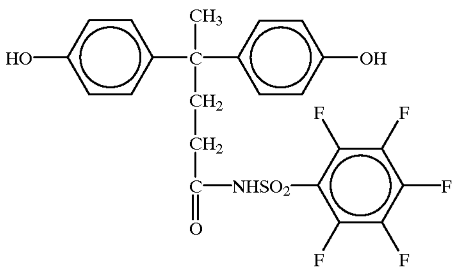

-continued

UM-14

UM-15

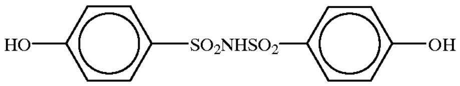

UM-16

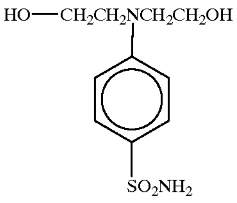

UM-17

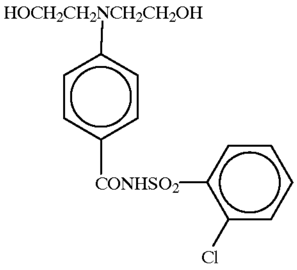

The urethane resin according to the present invention can be synthesized using, e.g., the diol component mentioned above in combination with a diisocyanate component and, if desired, diol compounds other than the aforementioned diol component, and heating these two components in an aprotic solvent in the presence of a known active catalyst.

Besides the diisocyanates defined as the constituent monomers (1), (2) and (3), known diisocyanates can be used as the diisocyanate component for polyurethane resins according to the present invention.

Examples of known diisocyanates which can be used include aromatic diisocyanate compounds, such as 2,4-tolylenediisocyanate, 2,4-tolylenediisocyanate dimer, 2,6-tolylenediisocyanate, p-xylylenediisocyanate, m-xylylenediisocyanate, 4,4'-diphenylmethanediisocyanate, 1,5-naphthylenediisocyanate and 3,3'-dimethylbiphenyl-4,4'-diisocyanate; aliphatic diisocyanate compounds, such as hexamethylenediisocyanate, trimethylhexamethylenediisocyanate, lysine diisocyanate and dimer acid diisocyanate; alicyclic diisocyanate compounds such as isophorone diisocyanate, 4,4'-methylenebis(cyclohexylisocyanate), methylcyclohexane-2,4 (or 2,6)-diisocyanate and 1,3-(isocyanatomethyl)cyclohexane; and reaction products of diols and diisocyanates, such as the adduct prepared from one mole of 1,3-butylene glycol and 2 moles of tolylenediisocyanate.

Examples of other diols which can be used, besides the constituent monomers (1), (2) and (3) defined as the diol component according to the present invention, include ethylene glycol, diethylene glycol, triethylene glycol, tetraethylene glycol, neopentyl glycol, 1,3-butylene glycol, 1,6-hexanediol, 2-butyl-1,4-diol, 2,2,4-trimethyl-1,3-pentanediol, 1,4-bis-β-hydroxyethoxycyclohexane, cyclohexane dimethanol, tricyclodecane dimethanol, hydrogenated bisphenol A, hydrogenated bisphenol F, the adduct of bisphenol A and ethylene oxide, the adduct of bisphenol A and propylene oxide, the adduct of bisphenol F and ethylene oxide, the adduct of bisphenol F and propylene oxide, the adduct of hydrogenated bisphenol A and ethylene oxide, the adduct of hydrogenated bisphenol A and propylene oxide, hydroquinonedihydroxyethyl ether p-xylylene glycol, dihydroxyethylsulfone, bis(2-hydroxyethyl)-2,4-tolylenedicarbamate, 2,4-tolylene-bis(2-hydroxyethylcarbamide), bis(2-hydroxyethyl)-m-xylylenedicarbamate and bis(2-hydroxyethyl)isophthalate.

In addition to those diols, the polyoxyalkylene group-containing diol compounds described in JP-A-8-15858 can also be used.

Examples of a structure of the polyurethane resin according to the present invention are illustrated below.

Additionally, the figures in each structural formula indicate the mole fractions of constituent components corresponding thereto.

UP-1

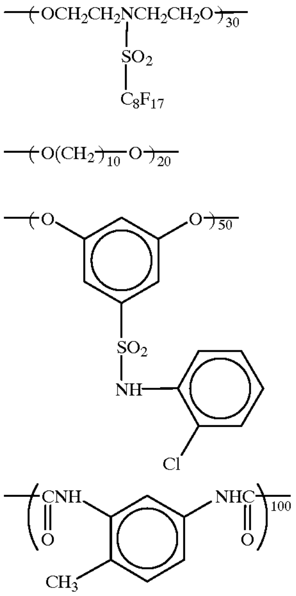

UP-2

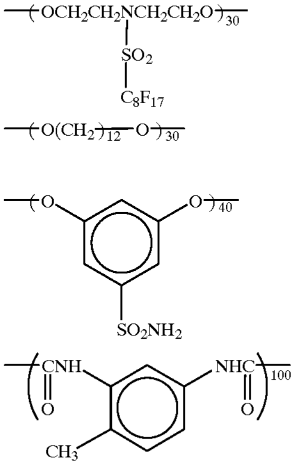

-continued (UP-3)

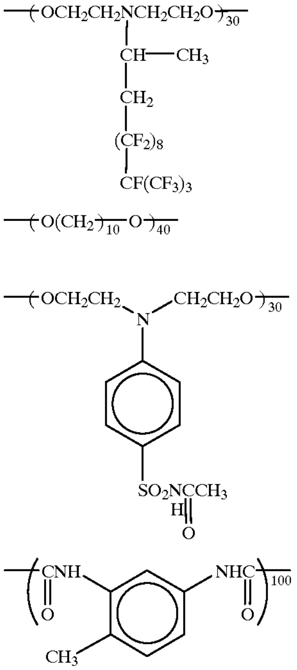

UP-4

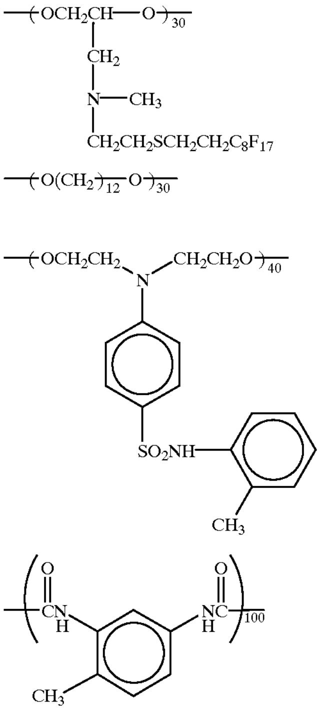

UP-5

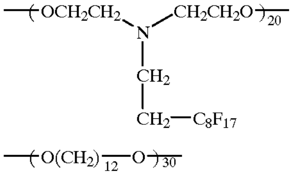

-continued

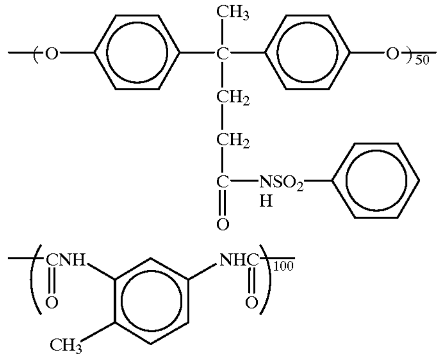

UP-6

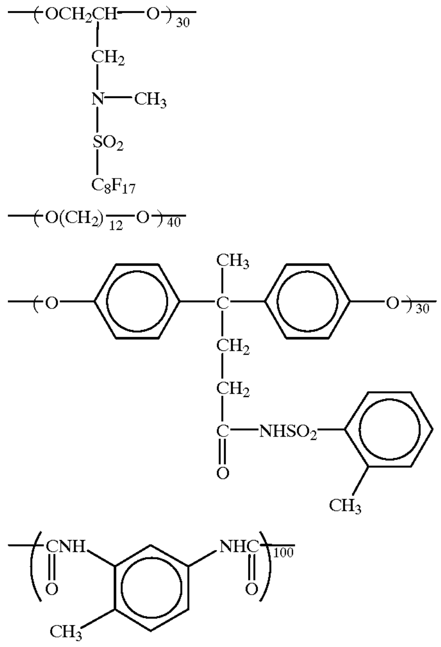

UP-7

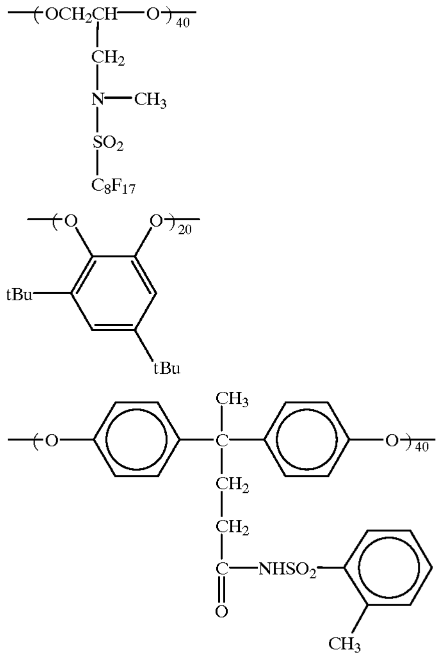

-continued

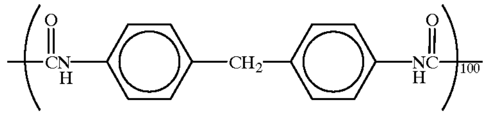

UP-8

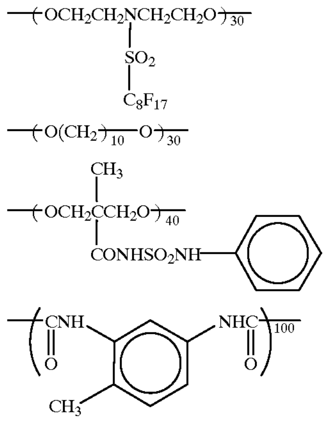

UP-9

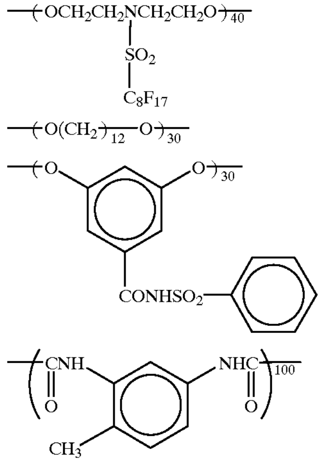

The fluorine-containing polyurethane resin used in the present invention generally has an average molecular weight of from 3,000 to 200,000, preferably from 6,000 to 100,000. The fluorine-containing polyurethane resin according to the present invention is used generally in a proportion of 0.001 to 10% by weight, preferably from 0.1 to 5% by weight, to the total components (excluding a solvent) of the photosensitive composition.

The other components required for preparation of a positive working photosensitive composition according to the present invention are illustrated below.

As a photosensitive component of such a positive working photosensitive composition, any of compounds can be used so far as they change the solubility or swellability of the composition in a developer as a consequence of the exposure. Preferably, o-quinonediazide compounds are used as the photosensitive component. For instance, the positive working photosensitive composition can comprise an alkali-soluble resin and an o-quidnonediazide compound. Further, the chemically amplified photosensitive compositions as described in U.S. Pat. No. 4,491,628 and European Patent 249,139 can be utilized for the present invention.

There are known o-quinonediazide compounds having various structures, and the details thereof are described in J. Kosar, *Light-Sensitive Systems*, pp. 336–352, John Wiley & Sons, Inc. (1965).

In particular, o-benzoquinonediazide or o-naphthoquinonediazide sulfonic acid esters of various types of hydroxyl compounds are suitable for the positively working photosensitive component.

Examples of such an o-quinonediazide compound include the esters prepared from 1,2-naphthoquinone-2-diazido-4-sulfonyl chloride and phenol-formaldehyde or cresol-formaldehyde resins; the esters prepared from 1,2-naphthoquinone-2-diazido-5-sulfonyl chloride and pyrogallol-acetone resins, as described in U.S. Pat. No. 3,635,709; the esters prepared from 1,2-naphthoquinone-2-diazido-5-sulfonyl chloride and resorcinol-benzaldehyde resins, as described in JP-B-63-13528; the esters prepared from 1,2-naphthoquinone-2-diazido-5-sulfonyl chloride and resorcinol-pyrogallol•acetone co-condensation resins, as described in JP-B-62-44257; the products obtained by esterifying terminal hydroxyl group-containing polyesters with 1,2-naphthoquinone-2-diazido-5-sulfonyl chloride, as described in JP-B-56-45127; the products obtained by esterifying N-(4-hydroxyphenyl)methacrylamide homopolymer or copolymers of N-(4-hydroxylphenyl )methacrylamide and other monomers with 1,2-naphthoquinone-2-diazido-5-sulfonyl chloride, as described in JP-B-50-24641; the esters prepared from 1,2-naphthoquinone-2-diazido-5-sulfonyl chloride and bisphenol-formaldehyde resins, as described in JP-B-54-29922; the products obtained by esterifying p-hydroxystyrene homopolymer or copolymers of p-hydroxystyrene and other monomers with 1,2-naphthoquinone-2-diazido-5-sulfonyl chloride, as described in JP-B-52-36043; and the esters prepared from 1,2-naphthoquinone-2-diazido-5-sulfonyl chloride and polyhydroxybenzophenones.

Examples of other known o-quinonediazide compounds which can be used in the present invention include the o-quinonediazide compounds described in JP-A-63-80254, JP-A-58-5737, JP-A-57-111530, JP-A-57-111531, JP-A-57-114138, JP-A-57-142635, JP-A-51-36129, JP-B-62-3411, JP-B-62-51459 and JP-B-51-483.

The o-quinonediazide compound as recited above is generally used in an amount of 5 to 60% by weight, preferably 10 to 40% by weight, based on the total solids in a photosensitive composition.

Besides the o-quinonediazide compounds as recited above, a chemically amplifying system which comprises the combination of a photoacid generator with a compound having alkali-soluble group protected by an acid decomposable group can be used as the photosensitive component.

Examples of a photoacid generator which can be used in the chemically amplifying system include the diazonium salts described, e.g., in S. I. Schlesinger, *Photogr. Sci. Eng.*, 18, 387 (1974), and T. S. Bal et al., *Polymer*, 21, 423 (1980); onium salts, such as the ammonium salts described, e.g., in U.S. Pat. Nos. 4,069,055 and 4,069,056, and JP-A-3-140140, the phosphonium salts described, e.g., in D. C. Necker et al., *Macromolecules*, 17, 2468 (1984), C. S. Wen et al., *Teh. Proc. Conf. Rad. Curing ASIA*, p. 478, Tokyo (Oct., 1988), and U.S. Pat. Nos. 4,069,055 and 4,069,056, the iodonium salts described, e.g., in J. V. Crivello et al., Macromolecules, 10(6), 1307 (1977), *Chem. & Eng. News*, Nov. 28, p. 31 (1988), European Pat. No. 104,143, U.S. Pat. Nos. 339,049 and 410,210, JP-A-2-150848 and JP-A-2-296514, the sulfonium salts described, e.g., in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci.*, Polymer Chem. Ed., 17, 2877 (1979), European Patent No. 370,693, U.S. Pat. No. 3,902,114, European Pat. Nos. 233,567, 297,443 and 297,422, U.S. Pat. Nos. 4,933,377, 410,201, 339,049, 4,760,013, 4,734,444 and 2,833,827, and German Patents 2,904,626, 3,604,580 and 3,604,581, the selenonium salts described, e.g., in J. V. Crivello et al., *Macromolecules*, 10(6), 1307 (1977), and J. V. Crivello et al., *J. Polymer Sci.*, Polymer Chem. Ed., 17, 1047 (1979), and the arsonium salts described, e.g., in C. S. Wen et al., *Teh. Proc. Conf. Rad. Curing ASIA*, p. 478, Tokyo (October, 1988); the organic halogen-compounds described, e.g., in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; the organometallic compounds/organic halides described, e.g., in K. Meier et al., *J. Rad. Curing*, 13(4), 26 (1986), T. P. Gill et al., *Inorg. Chem.*, 19, 3007 (1980), D. Astruc, *Acc. Chem. Res.*, 19(12), 377 (1896), and JP-A-2-161445; the photoacid generators having o-nitrobenzyl type protective groups described, e.g., in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130(6), F. M. Houlihan et al., *Macromolecules*, 21, 2001 (1988), European Patents 0,290,750, 0,046,083, 0,156,535, 0,271,851 and 0,388,343, U.S. Pat. Nos. 3,901,710 and 4,181,531, JP-A-60-198538 and JP-A-53-133022; the compounds generating a sulfonic acid by photolysis, the representatives of which are iminosulfonates and so on, as described, e.g., in M. Tunooka et al., *Polymer Preprints Japan*, 35(8), G. Berner et al., *J. Rad. Curing*, 13(4), W. J. Mijs et al., *Coating Technol.*, 55(697), 45(1983), Akzo, H. Adachi et al., *Polymer Preprints Japan*, 37(3), European Patents 0,199,672, 0,084,515, 0,044,115 and 0,101,122, U.S. Pat. Nos. 4, 618, 564, 4,371,605 and 4,431,774, JP-A-64-18143, JP-A-2-245756 and Japanese Patent Application No. 3-140109: and the disulfone compounds described, e.g., in JP-A-61-166544.

Of the above-recited compounds which are decomposed by irradiation with actinic rays or radiations to generate acids, the compounds used to particular advantage in the present invention are illustrated below.

(1) A trihalomethyl-substituted oxazole compound of the following formula (PAG1), or a trihalomethyl-substituted s-triazine compound of the following formula (PAG2):

(PAG1)

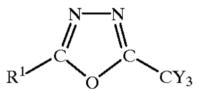

-continued (PAG2)

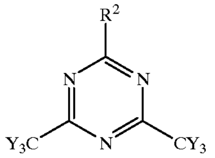

wherein $R^1$ is a substituted or unsubstituted aryl or alkenyl group; $R^2$ is a substituted or unsubstituted aryl, alkenyl or alkyl group, or $—C(Y)_3$; and Y is a chlorine or bromine atom.

Examples of such compounds are illustrated below, but these examples should not be construed as limiting the scope of the present invention.

(PAG1-1)

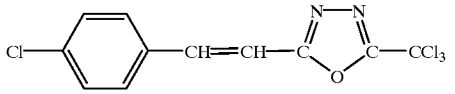

(PAG1-2)

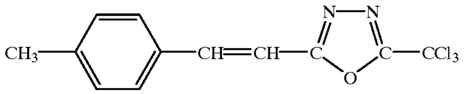

(PAG2-1)

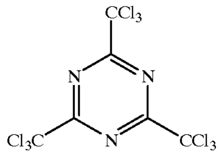

(PAG2-2)

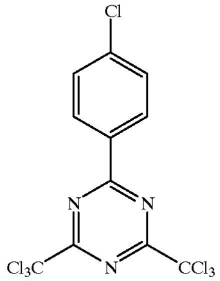

(PAG2-3)

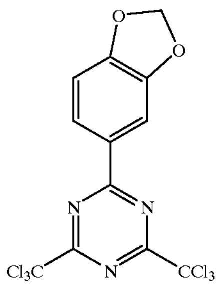

-continued (PAG2-4)

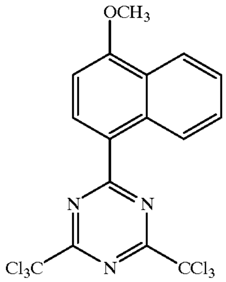

(PAG2-5)

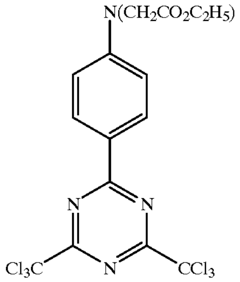

(2) An iodonium salt of the following formula (PAG3), or a sulfonium salt of the following formula (PAG4), or a diazonium salt:

(PAG3)

(PAG4)

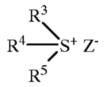

In the above formulae, $Ar^1$ and $Ar^2$ each are an aryl group which can have a substituent. Suitable examples of such a substituent include an alkyl group, a haloalkyl group, a cycloalkyl group, an aryl group, an alkoxy group, a nitro group, a carboxyl group, an alkoxycarbonyl group, a hydroxyl group, a mercapto group and a halogen atom.

$R^3$, $R^4$ and $R^5$ each are a substituted or unsubstituted alkyl or aryl group. Preferably, each of them is an aryl group having 6 to 14 carbon atoms or an alkyl group having 1 to 8 carbon atoms, which can have a substituent. Examples of a substituent suitable for the aryl group include an alkoxy group having 1 to 8 carbon atoms, an alkyl group having 1 to 8 carbon atoms, a nitro group, a carboxyl group, a hydroxyl group and a halogen atom, and those for the alkyl group include an alkoxy group having 1 to 8 carbon atoms, a carboxyl group and an alkoxycarbonyl group.

$Z^-$ is a counter anion, including $BF_4^-$, $AsF_6^-$, $PF_6^-$, $SbF_6^-$, $SiF_6^-$, $ClO_4^-$, a perfluoroalkanesulfonic acid anion such as $CF_3SO_3^-$, a pentafluorobenzenesulfonic acid anion, a condensed polynuclear aromatic sulfonic acid anion such as naphthalene-1-sulfonic acid anion, an anthraquinone-sulfonic acid anion, and sulfonic acid group-containing dyes, but the counter anion should not be construed as being limited to these examples.

Further, two among $R^3$, $R^4$ and $R^5$, and two of $Ar^1$ and $Ar^2$ as well, may combine with each other via a single bond or a substituent.

Examples of such compounds are illustrated below, but these examples should not be construed as limiting the scope of the present invention.

(PAG3-1)

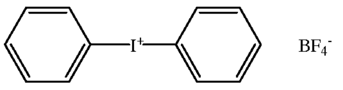

(PAG3-2)

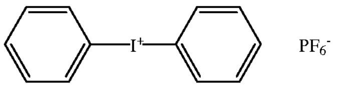

(PAG4-1)

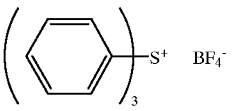

(PAG4-2)

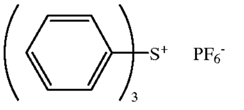

(PAG4-3)

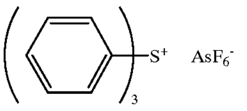

The above-illustrated onium salts of formulae (PAG3) and (PAG4) are known compounds, and can be prepared using the methods described, e.g., in J. W. Knapczyk et al., *J. Am. Chem. Soc.*, 91, 145 (1969), A. L. Maycok et al., *J. Org. Chem.*, 35, 2532 (1970), B. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) A disulfone compound of the following formula (PAG5) or an iminosulfonate compound of the following formula (PAG6):

(PAG5)

$$Ar^3-SO_2-SO_2-Ar^4$$

(PAG6)

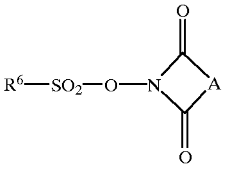

wherein $Ar^3$ and $Ar^4$ each are a substituted or unsubstituted aryl group; $R^6$ is a substituted or unsubstituted alkyl or aryl group; and A is a substituted or unsubstituted alkylene, alkenylene or arylene group.

Examples of such compounds are illustrated below, but these examples should not be construed as limiting the scope of the present invention.

(PAG5-1)

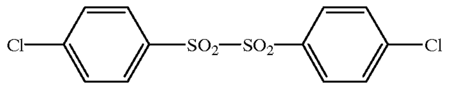

(PAG5-2)

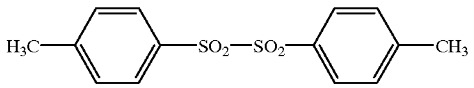

(PAG6-1)

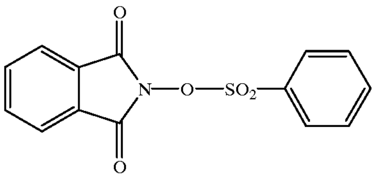

(PAG6-2)

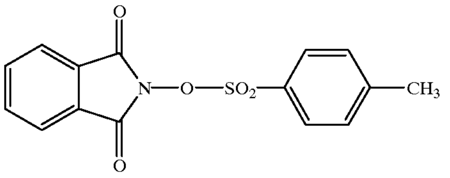

These compounds, which are decomposed by irradiation with actinic rays or radiations to produce acids, are added in a proportion of generally from 0.001 to 40% by weight, preferably from 0.01 to 20% by weight, more preferably from 0.1 to 5% by weight, to the total solids in the photosensitive composition (excluding the solvent used).

The compound having an alkali-soluble group, which is protected by an acid decomposable group, is a compound having a —C—O—C— or —C—O—Si— linkage, with examples including the following compounds:

(a) a compound which has polymerizability and contains at least one orthocarboxylic acid ester and/or carboxylic acid amide acetal group which can turn into a cross-linking element in the main chain or a substituent in the side chain when the compound undergoes polymerization, (b) an oligomeric or polymeric compound having repeated acetal and/or ketal groups in the main chain, (c) a compound having at least one enol ester or N-acylaminocarbonate group, (d) a cyclic acetal or ketal of a β-keto-ester or β-keto-amide, (e) a compound having a silyl ether group, (f) a compound having a silyl enol ether group, (g) a monoacetal or monoketal whose aldehyde or ketone component has a solubility of 0.1 to 100 g/l in a developer, (h) an ether of a tertiary alcohol, and (i) a carboxylic acid ester and carbonic acid ester of an allyl or benzyl alcohol.

The compounds of type (a), which are cleavable with an acid and act as a component of irradiation responsive mixtures, are described in German Patent Application (OLS) Nos. 2,610,842 and 2,928,636. The mixtures containing the compounds of type (b) are described in German Patents 2,306,248 and 2,718,254. The compounds of type (c) are described in EP-A-0006626 and EP-A-0006627. The compounds of type (d) are described in EP-A-0202196, and the compounds of type (e) are described in German Patent Application (OLS) Nos. 3,544,165 and 3,601,264. The compounds of type (f) are described in German Patent Application (OLS) Nos. 3,730,785 and 3,730,783, and the compounds of type (g) are described in German Patent Application (OLS) No. 3,730,783. The compounds of type (h) are described, e.g., in U.S. Pat. No. 4,603,101, and the compounds of type (i) are described, e.g., in U.S. Pat. No. 4,491,628 and J. M. Frechet et al., *J. Imaging Sci.*, 30, 59–64 (1986).

The compounds protected by those acid decomposable groups are used in an amount of 1 to 60% by weight, preferably 5 to 40% by weight, based on the total solids in a photosensitive composition.

Examples of a synthetic resin which is insoluble in water but soluble in an alkaline aqueous solution (hereinafter referred to as "an alkali-soluble resin") include phenol-formaldehyde resins, cresol-formaldehyde resins, phenol-cresol-formaldehyde co-condensation resins, phenol-modified xylene resins, polyhydroxystyrenes, halogenated polyhydroxystyrenes, N-(4-hydroxyphenyl)methacrylamide copolymers, hydroquinone monomethacrylate copolymers, the sulfonylimide polymers described in JP-A-7-28244 and the carboxyl group-containing polymers described in JP-A-7-36184. Besides those alkali-soluble resins, other alkali-soluble high molecular compounds, such as the phenolic hydroxyl group-containing acrylic resins as disclosed in JP-A-51-34711, the sulfonamido group-containing acrylic resins disclosed in JP-A-2-866 and urethane resins, can be used. It is desirable for those alkali-soluble high molecular compounds to have a weight average molecular weight of 500 to 20,000 and a number average molecular weight of 200 to 60,000.

The alkali-soluble high molecular compounds as recited above may be used alone or as a mixture of two or more thereof, and they are added in a proportion of not more than 80% by weight to the total composition.

Further, as described in U.S. Pat. No. 4,123,279, the use of an alkali-soluble high molecular compound as recited above in combination with a condensate of a phenol having an alkyl group having 3 to 8 carbon atoms as a substituent and formaldehyde, such as a t-butylphenol-formaldehyde resin or an octylphenol-formaldehyde resin, is advantageous in view of improvement in ink receptivity of images. Such a combination is used in a proportion of not more than 90% by weight to the total composition.

The photosensitive composition may contain, a cyclic acid anhydride for increasing the sensitivity, a printing-out agent for obtaining visual images just after exposure, a dye as an image coloring agent, a filler, and the like, if desired.

For the purpose of increasing the sensitivity, it is desirable to add a cyclic acid anhydride, a phenol and an organic acid to the photosensitive composition of the present invention.

Examples of cyclic acid anhydrides which can be added include phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride and pyromellitic anhydride, as described in U.S. Pat. No. 4,115,128.

Examples of phenols which can be added for the foregoing purpose include bisphenol A, p-nitrophenol, p-ethoxyphenol, 2,3,4-trihydroxybenzophenone, 4-hydroxybenzophenone, 2,4,4'-trihydroxybenzophenone, 4,4,4"-trihydroxy-triphenylmethane and 4,4',3",4"-tetrahydroxy-3,5,3',5'-tetramethyltriphenylmethane.

Examples of organic acids which can be added for the foregoing purpose include those described, e.g., in JP-A-60-88942 and JP-A-2-96755, such as sulfonic acids, sulfinic acids, alkylsulfuric acids, phosphonic acids, phosphinic acids, phosphates and carboxylates. More specifically, the acids which can be added are p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluylic acid, 3,4-dimethoxybenzoic acid, phthalic acid, terephthalic acid, 1,4-cyclohexene-2,2-dicarboxylic acid, erucic acid, lauric acid, n-undecanoic acid, ascorbic acid and so on.

The proportion of the foregoing cyclic acid anhydrides, phenols and organic acids in a photosensitive composition according to the present invention is preferably from 0.05 to 15% by weight, more preferably from 0.1 to 5% by weight.

As an example of the printing-out agent for producing a visual image just after exposure, mention may be made of the combination of a photosensitive compound capable of releasing an acid upon exposure and an organic dye capable of changing its tone by forming a salt together with the acid.

Examples of such a photosensitive compound capable of releasing an acid upon exposure include the o-naphthoquinonediazide-4-sulfonic acid halogenides described in JP-A-50-36209, the trihalomethyl-2-pyrones and the trihalomethyl-s-triazines described in JP-A-53-36223, the various o-naphthoquinonediazide compounds described in JP-A-55-62444, the 2-trihalomethyl-5-aryl-1,3,4-oxadiazole compounds described in JP-A-55-77742, and diazonium salts. These compounds can be used alone or as a mixture of two or more thereof, and the suitable addition amount thereof is from 0.3 to 15% by weight, based on the total composition.

In a photosensitive composition according to the present invention can be used at least one organic dye capable of changing its tone by interacting with the photolysis product of a compound which produces an acidic substance by photolysis. Examples of such an organic dye include diphenylmethane dyes, triarylmethane dyes, thiazine dyes, oxazine dyes, phenazine dyes, xanthene dyes, anthraquinone dyes, iminonaphthoquinone dyes and azomethine dyes. More specifically, the dyes which can be used practically are Brilliant Green, Eosine, Ethyl Violet, Erythrosine B, Methyl Green, Crystal Violet, Basic Fuchsine, phenolphthalein, 1,3-diphenyltriazine, Alizarin Red S, Thymolphthalein, Methyl Violet 2B, Quinaldine Red, Rose Bengale, Thymolsulfophthalein, Xylenol Blue, Methyl Orange, Orange IV, diphenyl thiocarbazone, 2,7-dichlorofluorescein, Para Methyl Red, Congo Red, Benzopurpurine 4B, α-Naphthyl Red, Nile Blue 2B, Nile Blue A, phenacetarin, Methyl Violet, Malachite Green, Para Fuchsine, Oil Blue #603 (produced by Orient Chemical Industry Co., Ltd.), Oil Pink #312 (produced by Orient Chemical Industry Co., Ltd.), Oil Red 5B (produced by Orient Chemical Industry Co., Ltd.), Oil Scarlet #308 (produced by Orient Chemical Industry Co., Ltd.), Oil Red OG (produced by Orient Chemical Industry Co., Ltd.), Oil Red RR (produced by Orient Chemical Industry Co., Ltd.), Oil Green #502 (produced by Orient Chemical Industry Co., Ltd.), Spiron Red BEH Special (produced by Hodogaya Chemical Co., Ltd.), Victoria Pure Blue BOH (produced by Hodogaya Chemical Co., Ltd.), Patent Pure Blue (produced by Sumitomo Mikuni Chemical Co., Ltd.), Sudan Blue II (produced by BASF), m-Cresol purple, Cresol Red, Rhodamine B, Rhodamine 6G, Fast Acid Violet R, Sulfo Rhodamine B, Auramine, 4-p-diethylaminophenyliminonaphthoquinone, 2-carboxyanilino-4-p-diethylaminophenyliminonaphthoquinone, 2-carbostearylamino-4-p-dihydroxyethyl-amino-phenyliminonaphthoquinone, p-methoxybenzoyl-p'-diethylamino-o'-methylphenyliminoacetanilide, cyano-p-diethylaminophenyliminoacetanilide,1-phenyl-3-methyl-4-p-diethylaminophenylimino-5-pyrazolone, 1-β-naphthyl-4-p-diethylaminophenylimino-5-pyrazolone, and so on.

Particularly preferred organic dyes are triarylmethane dyes. Of the triarylmethane dyes, the dyes as described in JP-A-62-2932471 and Japanese Patent Application No. 4-112844, which have sulfonic acid compounds as their counter ions, are especially useful.

Those dyes can be used alone or as a mixture of two or more thereof, and the suitable addition amount thereof is from 0.3 to 15% by weight, based on the total photosensitive composition. Further, they can be used in combination with other dyes and pigments, if desired. The proportion of other dyes and pigments is from at most 70% by weight, preferably at most 50% by weight, to the sum total of dyes and pigments.

The photosensitive composition can further contain various resins having hydrophobic groups for the purpose of improving the ink-receptivity of images, such as an octylphenol-formaldehyde resin, a t-butylphenol-formaldehyde resin, a t-butylphenol-benzaldehyde resin, a rosin-modified novolak resin and o-naphthoquinonediazidosulfonic acid esters of those modified novolak resins; a plasticizer for improving the flexibility of the coating, such as dibutyl phthalate, dioctyl phthalate, butyl glycolate, tricresyl phosphate and dioctyl adipate; and other additives for various purposes. The proportion of those additives to the total composition is preferably from 0.01 to 30% by weight.

The photosensitive composition may further contain a known resin for improving the abrasion resistance of a coating. Examples of such a resin include polyvinyl acetal resins, polyurethane resins, epoxy resins, vinyl chloride resins, nylon, polyester resins and acrylic resins. These resins can be used alone or as a mixture of two or more thereof, and the suitable proportion thereof to the total composition is from 2 to 40% by weight.

For extending the development latitude, the nonionic surfactants as described in JP-A-62-251740 and JP-A-4-68355 and the amphoteric surfactants as described in JP-A-59-121044 and JP-A-4-13149 can be added to the photosensitive composition.

Examples of the nonionic surfactant which can be added include sorbitan tristearate, sorbitan monopalmitate, sorbitan trioleate, stearic acid monoglyceride, polyoxyethylene sorbitan monooleate and polyoxyethylene nonylphenyl ether, and examples of the amphoteric surfactant include alkyl(diaminoethyl) glycines, alkylpolyaminoethylglycine hydrochlorides, Amorgen K (trade name of an amphoteric surfactant of N-tetradecyl-N,N-betaine type, the product of Dai-ich Kogyo Co., Ltd.), 2-alkyl-N-carboxyethyl-N-hydroxyethylimidazolium betaines and Lebon 15 (trade name of an amphoteric surfactant of alkylimidazoline type, the product of Sanyo Chemical Industries Co., Ltd.).

The proportion of the nonionic surfactant and amphoteric surfactant ranges from 0.05 to 15% by weight, preferably from 0.1 to 5% by weight, based on the photosensitive composition.

To each of the present photosensitive compositions, surfactants for improving the coating properties, e.g., the fluorine-containing surfactants as described in JP-A-62-170950 can be added. The suitable proportion of such a surfactant is in the range of 0.001 to 1.0% by weight, particularly 0.005 to 0.5% by weight to the total photosensitive composition.

The yellow dyes illustrated below can be added to the photosensitive composition:

e) yellow dyes which are represented by the following formulae [I], [II] and [III], and which have an absorbance at 417 nm corresponding to at least 70% of the absorbance at 436 nm;

[I]

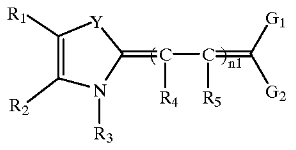

(wherein $R_1$ and $R_2$ each are a hydrogen atom, an alkyl group having 1 to 10 carbon atoms, an aryl group or an alkenyl group, and may combine with each other to complete a ring; $R_3$, $R_4$ and $R_5$ each are a hydrogen atom or an alkyl group having 1 to 10 carbon atoms; $G_1$ and $G_2$ each are an alkoxycarbonyl group, an aryloxycarbonyl group, an acyl group, an arylcarbonyl group, an alkylthio group, an arylthio group, an alkylsulfonyl group, an arylsulfonyl group or a fluoroalkylsulfonyl group, or $G_1$ and $G_2$ may combine with each other to complete a ring; and further, at least one of these substituents $R_1$, $R_2$, $R_3$, $R_4$, $R_5$, $G_1$ and $G_2$ has at least one sulfonic acid group, a carboxyl group, a sulfonamido group, an imido group, a N-sulfonylamido group, a phenolic hydroxyl group, a sulfonimido group, a metallic salt of any of these groups, or an inorganic or organic ammonium salt of any of these groups; Y is a divalent atomic group selected from among —O—, —S—, —NR— (wherein R is a hydrogen atom, an alkyl group or an aryl group), —Se—, —$C(CH_3)_2$— and —CH=CH—; and $n_1$ is 0 or 1),

[II]

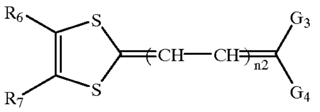

(wherein $R_6$ and $R_7$ each are a hydrogen atom, an alkyl group, a substituted alkyl group, an aryl group, a substituted aryl group, a heterocyclic group, a substituted heterocyclic group, an allyl group or a substituted allyl group, or they may combine to form a ring together with the carbon atoms to which they are bonded; $n_2$ is 0, 1 or 2; $G_3$ and $G_4$ each are a hydrogen atom, a cyano group, an alkoxycarbonyl group, a substituted alkoxycarbonyl group, an aryloxycarbonyl group, a substituted aryloxycarbonyl group, an acyl group, a substituted acyl group, an arylcarbonyl group, a substituted arylcarbonyl group, an alkylthio group, an arylthio group, an alkylsulfonyl group, an arylsulfonyl group or a fluoroalkylsulfonyl group, with the proviso that $G_3$ and $G_4$ are not hydrogen atoms at the same time, or $G_3$ and $G_4$ may combine to form a ring, which is composed of non-metallic atoms, together with the carbon atom they are bonded to; and further, at least one of these substituents $R_6$, $R_7$, $G_3$ and $G_3$ has at least one sulfonic acid group, a carboxyl group, a sulfonamido group, an imido group, a N-sulfonylamido group, a phenolic hydroxyl group, a sulfonimido group, a metallic salt of any of these groups, or an inorganic or organic ammonium salt of any of these groups),

[III]

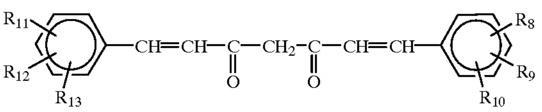

($R_8$, $R_9$, $R_{10}$, $R_{11}$, $R_{12}$ and $R_{13}$, which may be the same or different, each represent a hydrogen atom, an alkyl group, a substituted alkyl group, an aryl group, a substituted aryl group, an alkoxyl group, a hydroxyl group, an acyl group, a cyano group, an alkoxycarbonyl group, an aryloxycarbonyl group, a nitro group, a carboxyl group, a chlorine atom or a bromine atom).

In preparing a photosensitive material for a lithographic printing plate from a photosensitive composition comprising a fluorine-containing polymer according to the present invention, the photosensitive composition is first provided on an appropriate support. Specifically, the photosensitive composition is dissolved or dispersed in a single or mixed solvent as described below, coated on a support and then dried.

Although any of conventional organic solvents can be used, those having a boiling point of from 40° C. to 200° C., particularly from 60° C. to 160° C., are used to advantage from the viewpoint of drying. Of course, it is desirable to select a solvent which can dissolve the fluorine-containing surfactant according to the present invention.

Examples of an organic solvent which can be preferably used include alcohols, such as methyl alcohol, ethyl alcohol, n- or iso-propyl alcohol, n- or iso-butyl alcohol and diacetone alcohol; ketones, such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone and acetylacetone; hydrocarbons, such as benzene, toluene, xylene, cyclohexane and methoxybenzene; acetic acid esters, such as ethyl acetate, n- or iso-propyl acetate, n- or iso-butyl acetate, ethylbutyl acetate and hexyl acetate; halogenides, such as methylene dichloride, ethylene dichloride and monochlorobenzene; ethers, such as isopropyl ether, n-butyl ether, dioxane, dimethyldioxane and tetrahydrofuran; polyhydric alcohols and derivatives thereof, such as ethylene glycol, methyl cellosolve, methyl cellosolve acetate, ethyl cellosolve, diethyl cellosolve, cellosolve acetate, butyl cellosolve, butyl cellosolve acetate, methoxymethoxyethanol, diethylene glycol monomethyl ether, diethylene glycol dimethyl ether, diethylene glycol methyl ethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether and 3-methyl-3-methoxybutanol; and special solvents, such as dimethyl sulfoxide and N,N-dimethylformamide. These solvents can be used alone or as a mixture of two or more thereof.

The suitable concentration of solids in the coating composition is from 2 to 50% by weight.

The composition of the present invention can be coated using various methods, such as a roll coating method, a dip coating method, an air knife coating method, a gravure coating method, a gravure offset coating method, a hopper coating method, a blade coating method, a wire doctor coating method and a spray coating method. The suitable dry coverage is from 0.3 to 4.0 g/m$^2$. The lower coverage rate, though it can afford the greater saving on the exposure amount for image formation, causes the greater reduction in film strength. Conversely, as the coverage rate is increased, the photosensitive film becomes stronger, although the amount of exposure required becomes greater. Thus, the high coverage rate can afford the printing plate having a high impression capacity.

The photosensitive composition coated on a support is generally dried with hot air. The drying temperature is generally from 30° C. to 200° C., preferably from 40° C. to 140° C. The drying temperature may be kept constant during drying, or may be raised stepwise.

In some cases, the drying with demoisturized air can bring about better results. For drying, it is suitable to supply hot air to the surface of the coated composition at a rate of 0.1 to 30 m/sec, particularly 0.5 to 20 m/sec.

On the surface of the photosensitive layer formed in the above-described manner, it is desirable to provide a matte layer for the purpose of reducing the evacuating time upon contact exposure using a vacuum flame and preventing a halation from generating upon printing. Specifically, such a matte layer can be provided using the methods as described in JP-A-50-125805, JP-B-57-6582 and JP-B-61-28986, or the method of subjecting a solid powder to heat sealable adhesion as described in JP-B-62-62337.

The support which can suitably us ed for a photosensitive printing plate or the like is a dimensionally stable plate-form material, including materials hitherto used as supports of printing plates. Examples of such a support include paper, the paper on which plastic (e.g., polyethylene, propylene, polystyrene) is laminated, a plate of metal such as aluminum (including aluminum alloys), zinc, copper or iron, a film of plastic (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and the paper or plastic film on which the metallic as recited above is laminated. Of these supports, an aluminum plate is preferred over the others. The aluminum plate includes a pure aluminum plate and aluminum alloy plates. Examples of an aluminum alloy which can be used for a support include Al—Si, Al—Cu, Al—Mn, Al—Mg, Al—Cr, Al—Zn, Al—Pb, Al—Bi and Al—Ni alloys. These alloys may further contain not only small amounts of iron and titanium but also negligibly small amounts of impurities.

The support may be subjected to a surface treatment, if desired. For instance, the surface of a support used for a photosensitive printing plate can be subjected to a treatment for conferring water wettability thereon.

In the case of a metallic support, especially a support having an aluminum surface, it is desirable that the support undergo a surface treatment such as a graining treatment, a dipping treatment in an aqueous solution of sodium silicate, potassium fluorozirconate or phosphoric acid salt, or an anodic oxidation treatment. Other suitable supports are the aluminum plate which has undergone a graining treatment and then a dipping treatment in a water solution of sodium silicate, as described in U.S. Pat. No. 2,714,066, and the aluminum plate which has undergone an anodic oxidation treatment and then a dipping treatment in a water solution of alkaline metallic silicate, as described in U.S. Pat. No. 3,181,461. The foregoing anodic oxidation treatment is carried out by immersing an aluminum plate as an anode in an electrolytic solution, such as an aqueous solution of inorganic acid, such as phosphoric acid, chromic acid, sulfuric acid or boric acid, organic acid, such as oxalic acid or sulfaminic acid, or salt of such an acid, a nonaqueous solution or a mixture of two or more of such solutions, and sending an electric current thereto.

Also, the electrodeposition of a silicate as disclosed in U.S. Pat. No. 3,658,662 is effective.

The treatments as recited above are carried out not only for rendering the support surface hydrophilic, but also for preventing a harmful reaction from taking place between the support surface and a photosensitive composition provided thereon, and further for improving the adhesiveness of the support surface to a photosensitive layer provided thereon.

Prior to the graining treatment, the aluminum plate may be subjected to a pretreatment for removing a rolling oil from the surface thereof and baring a clean surface, if desired. For the former purpose, a solvent, such as trichlene, or a surfactant is used; while, for the latter purpose, a method of using an alkali etching agent, such as sodium hydroxide or potassium hydroxide, is generally adopted.

With respect to the graining method, any of mechanical, chemical and electrochemical methods can be adopted. Examples of a mechanical method include a ball rubbing method, a blast rubbing method, and a brush rubbing method wherein a nylon brush is used upon rubbing with a water-dispersed slurry of abrasive, such as pumice. As a chemical method, the method described in JP-A-54-31187, wherein the aluminum plate is immersed in a saturated water solution of aluminum salt of a mineral acid, is advantageously used. The method preferred as an electrochemical method is a method of carrying out AC electrolysis in an acidic electrolyte, such as hydrochloric acid, nitric acid or the combination thereof. Of these surface roughening methods, the combined use of mechanical and electrochemical surface-roughening methods as described in JP-A-55-137993 is effective in particular because it can ensure high adhesiveness to ink-receptive image in the support surface.

It is desirable that the graining treatment according to the method as described above be carried out so that the aluminum plate treated has a center-line surface roughness (Ra) of from 0.3 to 1.0 $\mu$m.

The thus grained aluminum plate is washed with water and then etched chemically, if desired.

The solution for the etching treatment is selected from aqueous base or acid solutions which can dissolve aluminum. Therein, it is required not to select a solution which contains a component capable of forming a film, other than an aluminum film, on the etched surface. Suitable examples of an etching agent include basic substances, such as sodium hydroxide, potassium hydroxide, trisodium phosphate, disodium phosphite, tripotassium phosphate and dipotassium phosphite; and acidic substances, such as sulfuric acid, persulfuric acid, phosphoric acid, hydrochloric acid and salts thereof. The salt of a metal having less ionization tendency than aluminum, such as zinc, chromium, cobalt, nickel and copper, is undesirable since it forms an unnecessary film on the etched surface.

It is most desirable to adjust the etching agent concentration and the etching temperature so that the dissolution rate of the aluminum or aluminum alloy be from 0.3 to 40 $g/m^2$ per minute of immersion time. Of course, the concentration and temperature adopted may be below or above the foregoing optimal range.

The etching treatment is carried out by immersing an aluminum plate in an etching solution as described above or applying an etching solution on an aluminum plate. It is desirable for the etching amount achieved therein to be from 0.5 to 10 $g/m^2$.

As the etching solution, aqueous base solutions are preferred because of their high etching speeds. When such solutions are used, smut is generated. Therefore, the etched aluminum plate is generally subjected to a desmutting treatment. For the desmutting treatment, acids such as nitric acid, sulfuric acid, phosphoric acid, chromic acid, hydrofluoric acid and borofluoric acid, can be used.

The etched aluminum plate is washed with water and subjected to anodic oxidation, if desired. The anodic oxidation can be carried out according to a conventional method. Specifically, a DC or AC electricity is supplied to an aluminum plate in an aqueous or nonaqueous solution containing sulfuric acid, phosphoric acid, chromic acid, oxalic acid, sulfaminic acid, benzenesulfonic acid or a combination of two or more thereof to form an anodically oxidized film on the surface of the aluminum plate.

The treatment condition for anodic oxidation largely depends on the electrolyte used. As a general guide, however, the following are appropriate conditions: The electrolyte concentration is from 1 to 80% by weight, the electrolyte temperature is from 5 to 70° C., the current density is from 0.5 to 60 $ampere/dm^2$, the voltage is from 1 to 100 V, and the electrolysis time is from 30 seconds to 50 minutes.

Of these anodic oxidation treatments, the method described in British Patent 1,412,768, wherein the anodic oxidation is performed in sulfuric acid under the condition of a high current density, and the method described in U.S. Pat. No. 3,511,661, wherein the anodic oxidation is carried out using phosphoric acid as an electrolytic bath, are preferred over the others.

The thus roughened and anodically oxidized aluminum plate may further undergo a water-wettability providing treatment. Examples of an agent suitable for such a treatment include the alkali metallic silicate solutions, e.g., a sodium silicate solution, disclosed in U.S. Pat. Nos. 2,714,066 and 3,181,461, potassium fluorozirconate disclosed in JP-B-36-22063 and polyvinylphosphonic acid disclosed in U.S. Pat. No. 4,153,461.

In the preparation of a photosensitive printing plate according to the present invention, it is desirable to provide an organic undercoat layer on the aluminum support before coating a photosensitive layer thereon. The organic compound for the organic undercoat layer can be selected from various compounds, such as carboxymethyl cellulose, dextrin, gum arabic, amino group-containing phosphonic acids (e.g., 2-aminoethylphosphonic acid), organic phosphonic acids (e.g., unsubstituted and substituted phenylphosphonic acids, naphthylphosphonic acids, alkylphosphonic acids, glycerophosphonic acids, methylenediphosphonic acid, ethylenediphosphonic acid), organic phosphates (e.g., unsubstituted and substituted phenyl phosphates, naphthyl phosphates, alkyl phosphates, glycerophosphate), organic phosphinic acids (e.g., unsubstituted and substituted phenylphosphinic acids, naphthylphosphinic acids, alkylphosphinic acids, glycerophosphinic acids), amino acids (e.g., glycine, β-alanine), and hydroxyl group-containing amine hydrochlorides (e.g., triethanolamine hydrochloride). These compounds may be used as a mixture of two or more thereof.

Besides the above-recited compounds, at least one compound selected from the high molecular compounds having the constitutional repeating units represented by the following formula [IV], such as poly(p-vinylbenzoate), can be used:

[IV]

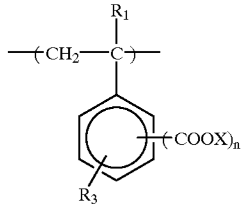

In the above formula, $R_1$ is a hydrogen atom, a halogen atom or an alkyl group, preferably a hydrogen atom, a chlorine atom or an alkyl group having 1 to 4 carbon atoms, particularly preferably a hydrogen atom or a methyl group.

$R_2$ and $R_3$ each are a hydrogen atom, a hydroxyl group, a halogen atom, an alkyl group, a substituted alkyl group, an aromatic group, a substituted aromatic group, —$R_4$, —$COOR_5$, —$CONHR_6$, —$COR_7$ or —CN, or they may combine with each other to form a ring. $R_4$ to $R_7$ each are an alkyl group or an aromatic group. Preferably, $R_2$ and $R_3$ each are a hydrogen atom, a hydroxyl group, a chlorine atom, an alkyl group having 1 to 4 carbon atoms, a phenyl group, —$R_4$, —$COOR_5$, —$CONHR_6$, —$COR_7$ or —CN, and $R_4$ to $R_7$ each are an alkyl group having 1 to 4 carbon atoms or a phenyl group. In particular, a hydrogen atom, a hydroxyl group, a methyl group or a methoxy group is preferred as $R_2$ and $R_3$.

X is a hydrogen atom, a metallic atom or —$NR_8R_9R_{10}R_{11}$. $R_8$ to $R_{11}$ each are a hydrogen atom, an alkyl group, a substituted alkyl group, an aromatic group or a substituted aromatic group, or $R_8$ and $R_9$ may combine with each other to form a ring. Preferably, X is a hydrogen atom, a monovalent metallic atom or —$NR_8R_9R_{10}R_{11}$, and $R_8$ to $R_{11}$ each are a hydrogen atom, an alkyl group having 1 to 4 carbon atoms or a phenyl group. Particularly preferably, X is a hydrogen atom, sodium, potassium or —$NR_8R_9R_{10}R_{11}$, and $R_8$ to $R_{11}$ each are a hydrogen atom, a methyl group or an ethyl group.

n is an integer of 1 to 3, preferably 1 or 2, more preferably 1.

The organic undercoat layer can be formed in either of the following processes: One process involves coating on an aluminum plate a solution of organic compound as recited above in water, an organic solvent, such as methanol, ethanol or methyl ethyl ketone, or a mixture of two or more of those solvents, and then drying the solution; and another process involves dipping an aluminum plate in a solution of organic compound as recited above in water, an organic solvent, such as methanol, ethanol or methyl ethyl ketone, or a mixture of two or more of those solvents to make the organic compound adsorb onto the aluminum plate, washing the aluminum plate with water or the like and then drying. In the former process, the solution containing the foregoing organic compound in a concentration of 0.005 to 10% by weight can be coated using various methods. For instance, any of bar coater coating, spin coating, spray coating and curtain coating methods may be adopted. In the latter process, the concentration of the solution used is in the range of 0.01 to 20% by weight, preferably 0.05 to 5% by weight, the dipping temperature in the range of 20 to 90° C., preferably 25 to 50° C., and the dipping time in the range of 0.1 sec to 20 min, preferably 2 sec to 1 min.

The solution used can be adjusted to pH 1 to 12 by adding thereto a basic substance, such as ammonia, triethylamine or potassium hydroxide, and an acidic substance, such as hydrochloric acid or phosphoric acid. In addition, yellow dyes can be added to the solution for the purpose of improvement in tone reproduction of the photosensitive printing plate.

It is desirable that the organic undercoat layer have a dry coverage rate of from 2 to 200 $mg/m^2$, preferably from 5 to 100 $mg/M^2$. When the coverage rate is less than 2 $mg/m^2$, sufficient printing impression cannot be obtained. Even when it is greater than 200 $mg/m^2$, on the other hand, a similar result is produced.

On the back side of the support, a back coating is provided, if desired. Suitable examples of such a back coating include the coatings of the organic high-molecular compounds described in JP-A-5-45885 and the coatings of the metallic oxides produced by hydrolysis and polycondensation of the organic or inorganic metallic compounds described in JP-A-6-35174.

Of these coatings, the coatings of the metallic oxides obtained from alkoxysilanes, such as $Si(OCH_3)_4$, $Si(OC_2H_5)_4$, $Si(OC_3H_7)_4$ and $Si(OC_4H_9)_4$, are preferred over the others because those silicon compounds are easily available at a low price and the coatings of the metallic oxides prepared therefrom have excellent resistance to developers.

EXAMPLES

The present invention will now be illustrated in more detail by reference to the synthesis examples of the specific fluorine-containing polymers and the examples of the photosensitive composition containing the polymers according to the present invention. However, the invention should not be construed as being limited to the following examples in any way.

First, the synthesis examples of the first fluorine-containing polymers and the examples of the photosensitive compositions containing the polymers are described below.

Synthesis Example 1A

In a three-necked 2 l flask, 163.2 g of 2-(perfluorooctyl) ethylacrylate, 74.5 g of N-(hydroxyphenyl)-methacrylamide, 80.1 g of lauryl methacrylate and 600 g of tetrahydrofuran were placed, and kept at 65° C. with stirring in a stream of nitrogen. Thereto, 13.05 g of 2,2'-azobis(2, 4-dimethylvaleronitrile) was added, and the stirring was continued. After 4 hours, the temperature was raised to 68° C. and maintained for 1 hour. At the completion of the reaction, the reaction solution was cooled to room temperature, and then poured into 3.8 l of water. The deposited solid was filtered off, and dried. Thus, a polymer $P_1$-1 according to the present invention was obtained.

The yield was 174 g, and the solid obtained was found to be a high-molecular compound having a weight average molecular weight of $1.5\times10^4$ by GPC.

Synthesis Examples 2A to 5A

Polymers according to the present invention, $P_1$-2 to $P_1$-5 shown in Table 1A, each were synthesized in the same manner as in Synthesis Example 1A.

Further, comparative polymers R-1 to R-7 having the structures illustrated below were each synthesized in the same manner as in Synthesis Example 1A.

TABLE 1A

| Synthesis Example | Polymer Name | Weight Average Molecular weight |
|---|---|---|
| 2A | $P_1$-2 | 22,000 |
| 3A | $P_1$-3 | 18,000 |
| 4A | $P_1$-4 | 21,000 |
| 5A | $P_1$-5 | 17,000 |
| Comparative 1A | R-1 | 15,000 |
| Comparative 2A | R-2 | 16,000 |
| Comparative 3A | R-3 | 18,000 |
| Comparative 4A | R-4 | 20,000 |
| Comparative 5A | R-5 | 19,000 |
| Comparative 6A | R-6 | 18,000 |

Structures of Comparative Polymers

R-1

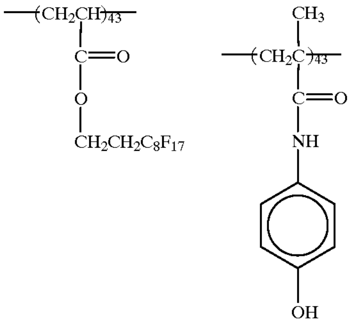

R-2

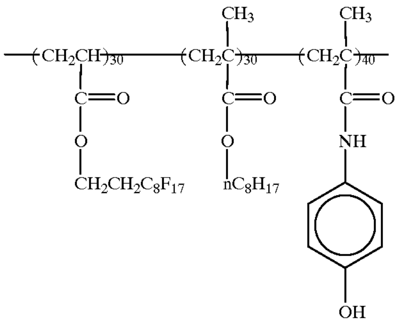

R-3

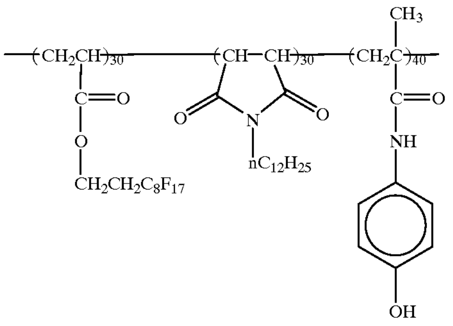

TABLE 1A-continued

| Synthesis Example | Polymer Name | Weight Average Molecular weight |
|---|---|---|

R-4

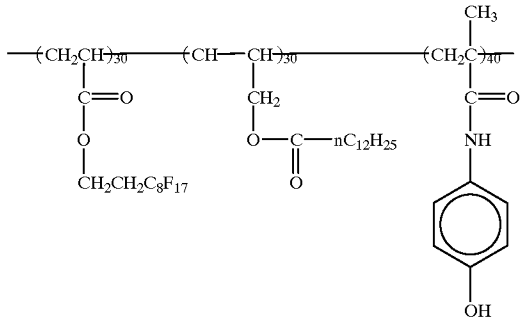

R-5

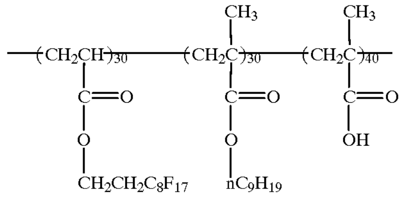

R-6

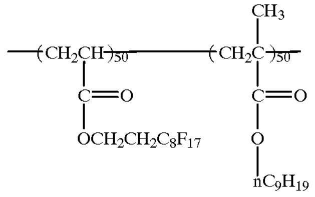

EXAMPLES 1A TO 5A AND COMPARATIVE EXAMPLES 1A TO 7A

In the following examples and comparative examples, all percentages are by weight unless otherwise indicated.

The surface of a 0.24 mm-thick aluminum plate (according to JIS A 1050) was subjected to a brush graining treatment using a rotary nylon brush described below while supplying thereto an aqueous suspension of pumice having an average grain size of about 2.1 $\mu$m. The first brush had a bristle length of 100 mm, a bristle diameter of 0.95 mm and a setting density of 70 bristles/$cm^2$, and the second brush had a bristle length of 80 mm, a bristle diameter of 0.295 mm and a setting density of 670 bristles/$cm^2$. Each of the brush rolls was rotated at 250 r.p.m. Subsequently to the brush graining treatment, the aluminum plate was thoroughly rinsed with water. Further, the plate was etched by 25 seconds' dipping in a 10% sodium hydroxide at 60° C., and then washed with running water. Then, the etched plate was cleaned by neutralization with 20% nitric acid, and rinsed with water. Furthermore, the resultant plate was subjected to an electrolytic surface-roughening treatment using a sine-wave alternating electric current under a potential of 12.7 V in a quantity of electricity of 160 Coulomb/$dm^2$ at the anode in a 1% aqueous solution of nitric acid. The surface roughness of the thus treated plate was measured, and the measured value thereof was 0.79 $\mu$m (expressed in Ra). Subsequently, the plate was dipped in a 1% aqueous solution of sodium hydroxide for 30 seconds at 40° C., and then desmutted by being immersed in a 30% aqueous solution of sulfuric acid for 40 seconds at 60° C. Thereafter, the plate was anodically oxidized in a 20% aqueous solution of sulfuric acid by sending thereto a direct electric current at the current density of 2 A/$dm^2$ till the oxidized film formed had a weight of 1.6 g/$m^2$. Thus, a substrate was prepared.

To the surface of the thus treated substrate, the following undercoat solution (A) was applied, and dried at 80° C. for 30 seconds. The dry coverage of the undercoat was 10 mg/$m^2$.

| Undercoat Solution (A) | |
|---|---|
| β-Alanine | 0.10 g |
| Methanol | 40 g |
| Purified water | 60 g |

On the thus obtained substrate (I), the sensitizing solution (A) shown in Table 2A was coated by means of a rod coater to provide a coverage of 12 ml/$m^2$, and dried at 100° C. for 1 minute to obtain a positive working photosensitive printing plate. The dry coverage was 1.10 g/$m^2$. In order to reduce a vacuum contact time, the matte layer was formed thereon according to the description in JP-B-61-28986.

TABLE 2A

| [Sensitizing Solution (A)] | |
|---|---|
| Esterification product of 1,2-diazonaphthoquinone-5-sulfonyl chloride and pyrogallol-acetone resin (described in Example 1 of U.S. Pat. No. 3,635,709) | 0.8 g |
| Cresol-formaldehyde novolak resin (meta/para ratio = 6/4; weight average molecular weight: 8,000) | 1.3 g |
| Phenol-formaldehyde novolak resin (weight average molecular weight: 15,000) | 0.4 g |
| Naphthoquinone-1,2-diazido-4-sulfonic acid chloride | 0.01 g |
| Tetrahydrophthalic anhydride | 0.02 g |
| Benzoic acid | 0.02 g |
| Pyrogallol | 0.02 g |
| 4-[p-N,N-bis(ethoxycarbonylmethyl)aminophenyl]-2,6-bis(trichloromethyl)-s-triazine (hereinafter referred to as "triazine A") | 0.07 g |
| Victoria Pure Blue BOH (product of Hodogaya Chemical Co., Ltd.) having the counter ion replaced by 1-naphthalene sulfonate ion | 0.045 g |
| F176PF | 0.01 g |
| Fluorine-containing polymer (See Table 3A) | 0.1 g |
| MEK/1-methoxy-2-propanol (3/2 by weight) | 25 g |

Additionally, the fluorine-containing polymer R-3 used in Comparative Example 6A was insoluble in the foregoing solvent, so that a mixture of 5 g of dimethylacetamide (DMAc) and 20 g of 1-methoxy-2-propanol (MFG) was used as the solvent.

The thus produced photosensitive printing plates were evaluated by the methods described below.

Sensitivity

Each photosensitive printing plate was exposed for 1 minute to a 3 kW metallic halide lamp placed at a distance of 1 m via a step wedge (produced by Fuji Photo Film Co., Ltd.) having a density difference of 0.15 per step. Then, the exposed plate was developed with an aqueous solution containing $SiO_2$ and $K_2O$ in a ratio of 1.16 and having a $SiO_2$ concentration of 1.4% for 12 seconds at 30° C., by means of a PS Processor 900U made by Fuji Photo Film Co., Ltd. The sensitivity was expressed in terms of the clear step number. Accordingly, the greater the number, the higher the sensitivity.

Gradation

The gradation was expressed in terms of the difference in number between the clear step number and solid step number in each sample used for the sensitivity evaluation described above. Accordingly, the smaller the number, the harder the gradation.

Development Latitude

The development latitude was evaluated as follows: Each photosensitive printing plate was exposed and developed under the same condition as in the foregoing sensitivity evaluation, except that the pH of the developer used was adjusted to the value higher or lower than the pH of the original developer by 0.2. The development latitude was expressed in terms of a change in number of the solid step number which was caused by the foregoing change in pH. Accordingly, the smaller the value, the better the development latitude.

The obtained results are shown in Table 3A.

TABLE 3A

| | Fluorine-containing Polymer | Sensitivity | Gradation | Development Latitude |
|---|---|---|---|---|
| Example 1A | $P_1$-1 | 7.0 | 5.5 | 5 |
| Example 2A | $P_1$-2 | 7.0 | 6.0 | 7 |
| Example 3A | $P_1$-3 | 7.0 | 5.0 | 4 |
| Example 4A | $P_1$-4 | 7.0 | 6.0 | 7 |
| Comparative Example 1A | not added | 7.0 | 6.5 | 8 |
| Comparative Example 2A | R-1 | 7.5 | 7.0 | 8 |
| Comparative Example 3A | R-2 | 7.0 | 6.5 | 8 |
| Comparative Example 4A | R-3 | 7.5 | 8.0 | 9 |
| Comparative Example 5A | R-4 | 6.5 | 7.0 | 8 |
| Comparative Example 6A | R-5 | 7.5 | 8.0 | 10 |
| Comparative Example 7A | R-6 | 4.0 | 6.5 | 8 |

It can be seen from Table 3A that Examples 1A to 4A exhibited high contrast and satisfactory development latitude without lowering the sensitivity.

EXAMPLES 5A TO 8A AND COMPARATIVE EXAMPLES 8A TO 9A

On the same substrate (I) as prepared in Examples 1A to 4A, each of the sensitizing solutions shown in Table 4A was coated by means of a rod coater to provide a coverage of 25 ml/$m^2$, and dried at 100° C. for 1 minute to obtain a positive working photosensitive printing plate. The dry coverage was 1.50 g/$m^2$. In order to reduce a vacuum contact time, the matte layer was formed thereon according to the description in JP-B-61-28986.

TABLE 4A

| [Sensitizing Solution] | |
|---|---|
| Esterification product of 1,2-diazonaphthoquinone-5-sulfonyl chloride and pyrogallol-acetone resin (described in Example 1 of U.S. Pat. No. 3,635,709) | 0.45 g |

TABLE 4A-continued

[Sensitizing Solution]

| | |
|---|---|
| Cresol-formaldehyde novolak resin (meta/para ratio = 6/4; weight average molecular weight: 4,000) | 1.5 g |
| m-Cresol-formaldehyde resin (weight average molecular weight: 2,000) | 0.5 g |
| Pyrogallol-acetone condensation product (weight average molecular weight: 2,200; number average molecular weight: 700) | 0.1 g |
| N-(p-Aminosulfonylphenyl)acrylamide/n-butyl-acrylate/diethylene glycol monomethylether methacrylate (40:40:20 by mole) terpolymer (weight average molecular weight: 40,000; number average molecular weight: 20,000) | 0.2 g |
| p-n-Octylphenol-formaldehyde resin (described in U.S. Pat. No. 4,123,279) | 0.02 g |
| Naphthoquinone-1,2-diazido-4-sulfonic acid chloride | 0.01 g |
| Tetrahydrophthalic anhydride | 0.02 g |
| Dye of structural formula (A) shown below | 0.007 g |
| Triazine A | 0.01 g |
| N-(1,2-naphthoquinone-2-diazido-4-sulfonyloxy)-cyclohexane-1,2-dicarboxylc acid imide | 0.01 g |
| Victoria Pure Blue BOH (product of Hodogaya Chemical Co., Ltd.) having the counter ion replaced by 1-naphthalene sulfonate ion | 0.045 g |
| 1-[α-Methyl-α-(4-hydroxy-3,5-dihydroxymethyl-phenyl)ethyl]-4-[α,α-bis(4-hydroxy-3,5-di-hydroxymethylphenyl)ethyl]benzene | 0.04 g |
| F176PF | 0.01 g |
| Fluorine-containing polymer (See Table 5A) | 0.08 g |
| Solvent (MEK/1-methoxy-2-propanol (3/2 by weight mixture) | 25 g |

Dye of Structural Formula A

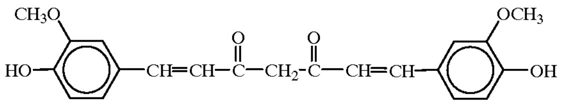

The photosensitive printing plates thus prepared were each exposed and developed in the same manner as in Examples 1A to 4A, and the sensitivity, the gradation and the development latitude of each plate were evaluated by the same methods as adopted in Examples 1A to 4A. The obtained results are shown in Table 5A.

TABLE 5A

| | Fluorine-containing Polymer | Sensitivity | Gradation | Development Latitude |
|---|---|---|---|---|
| Example 5A | $P_1$-2 | 6.0 | 5.5 | 6 |
| Example 6A | $P_1$-3 | 6.0 | 5.0 | 5 |

TABLE 5A-continued

| | Fluorine-containing Polymer | Sensitivity | Gradation | Development Latitude |
|---|---|---|---|---|
| Example 7A | $P_1$-7 | 6.0 | 6.0 | 7 |
| Example 8A | $P_1$-8 | 6.0 | 5.5 | 6 |
| Comparative Example 8A | not added | 6.0 | 6.5 | 8 |
| Comparative Example 9A | R-1 | 6.5 | 7.0 | 9 |

It can be seen from Table 5A that the photosensitive compositions prepared in Examples 5A to 8A according to the present invention were also successful in increasing the contrast and improving the development latitude without lowering the sensitivity.

Synthesis Example 1B

In a 500 ml of three-necked flask, 46.6 g of 2-(perfluorooctyl)ethylacrylate, 28.8 g of N-(4-sulfamoylphenyl)methacrylamide, 18.9 g of (n)-nonyl methacrylate and 180 g of dimethylacetamide were placed, and kept at 65° C. with stirring in a stream of nitrogen. Thereto, 3.73 g of 2,2'-azobis(2,4-dimethylvaleronitrile) was added, and the stirring was continued. After 4 hours, the temperature was raised to 68° C. and maintained for 1 hour as it was. At the completion of the reaction, the reaction solution was cooled to room temperature, and then poured into 400 ml of water. The deposited solid was filtered off, and dried. The yield was 32.5 g, and the solid obtained was found to be a high-molecular compound having a weight average molecular weight of $2.3 \times 10^4$ by GPC. The polymer obtained was $P_1$-16 according to the present invention.

Synthesis Examples 2B to 3B

Polymers according to the present invention, $P_1$-12 and $P_1$-15, shown in Table 1B were each synthesized in the same manner as in Synthesis Example 1B.

Further, comparative polymers R-7 and R-8 shown in Table 1B were each synthesized in the same manner as in Synthesis Example 1B.

TABLE 1B

| Synthesis Example | Polymer Name | Polymer Composition | | | Weight Average Molecular weight |
|---|---|---|---|---|---|
| 1B | $P_1$-16 | | | | 23,000 |
| 2B | $P_1$-12 | | | | 18,000 |
| 3B | $P_1$-15 | | | | 15,000 |
| Comparative 1B | R-7 | 2-(Perfluorooctyl)-ethylacrylate (0.05 mole) | — | M-1 (0.05 mole) | 20,000 |
| Comparative 2B | R-8 | 2-(Perfluorooctyl)-ethylacrylate (0.03 mole) | (n)-Nonylmeth-acrylate (0.03 mole) | Methacrylic acid (0.04 mole) | 21,000 |

EXAMPLES 1B TO 3B AND COMPARATIVE EXAMPLES 1B TO 3B

In the following examples and comparative examples, all percentages are by weight unless otherwise indicated.

The surface of a 0.24 mm-thick aluminum plate (according to JIS A 1050) was subjected to a brush graining treatment using a rotary nylon brush described below while supplying thereto an aqueous suspension of pumice having an average grain size of about 2.1 µm. The first brush had a bristle length of 100 mm, a bristle diameter of 0.95 mm and a setting density of 70 bristles /cm$^2$ and the second brush had a bristle length of 80 mm, a bristle diameter of 0.295 mm and a setting density of 670 bristles/cm$^2$. Each of the brush rolls was rotated at 250 r.p.m. Subsequently to the brush graining treatment, the aluminum plate was thoroughly rinsed with water. Further, the plate was etched by 25 seconds' immersion in a 10% sodium hydroxide at 60° C., and then washed with running water. Then, the etched plate was cleaned by neutralization with 20% nitric acid, and rinsed with water. Furthermore, the resultant plate was subjected to an electrolytic surface-roughening treatment using a sine-wave alternating electric current under a potential of 12.7 V in a quantity of electricity of 160 Coulomb/dm$^2$ at the anode in a 1% aqueous solution of nitric acid. The surface roughness of the thus treated plate was measured, and the measured value thereof was 0.79 μm (expressed in Ra). Subsequently, the plate was dipped in a 1% aqueous solution of sodium hydroxide for 30 seconds at 40° C., and then desmutted by being immersed in a 30% aqueous solution of sulfuric acid for 40 seconds at 60° C. Thereafter, the plate was anodically oxidized in a 20% aqueous solution of sulfuric acid by sending thereto a direct electric current at the current density of 2 A/dm$^2$ till the oxidized film formed had a weight of 1.6 g/m$^2$. Thus, a substrate was prepared.

To the surface of the thus treated substrate, the following undercoat solution (A) was applied, and dried at 80° C. for 30 seconds. The dry coverage of the undercoat was 10 mg/m$^2$.

| Undercoat Solution (A) | |
|---|---|
| β-Alanine | 0.10 g |
| Methanol | 40 g |
| Purified water | 60 g |

On the thus obtained substrate (I), each of the sensitizing solutions shown in Table 2B was coated by means of a rod coater to provide a coverage of 12 ml/m$^2$, and dried at 100° C. for 1 minute to obtain a positive working photosensitive printing plate. The dry coverage was 1.15 g/m$^2$. In order to reduce a vacuum contact time, the matte layer was formed thereon according to the description in JP-B-61-28986.

TABLE 2B

| [Sensitizing Solution] | |
|---|---|
| Esterification product of 1,2-diazonaphthoquinone-5-sulfonyl chloride and pyrogallol-acetone resin (described in Example 1 of U.S. Pat. No. 3,635,709) | 0.8 g |
| Cresol-formaldehyde novolak resin (meta/para ratio = 6/4; weight average molecular weight: 8,000) | 1.5 g |
| Phenol-formaldehyde novolak resin (weight average molecular weight: 15,000) | 0.2 g |
| N-(p-Aminosulfonylphenyl)acrylamide/n-butyl-acrylate/diethylene glycol monomethylether-methacrylate (40:40:20 by mole) terpolymer (weight average molecular weight: 40,000; number average molecular weight: 20,000) | 0.4 g |
| p-n-Octylphenol-formaldehyde resin (described in U.S. Pat. No. 4,123,279) | 0.02 g |
| Naphthoquinone-1,2-diazido-4-sulfonic acid chloride | 0.02 g |
| Tetrahydrophthalic anhydride | 0.16 g |
| Benzoic acid | 0.02 g |
| Pyrogallol | 0.05 g |

TABLE 2B-continued

| [Sensitizing Solution] | |
|---|---|
| Triazine A | 0.07 g |
| Victoria Pure Blue BOH (product of Hodogaya Chemical Co., Ltd.) having the counter ion replaced by 1-naphthalene sulfonate ion | 0.045 g |
| F176PF | 0.01 g |
| Fluorine-containing polymer (See Table 3B) | 0.1 g |
| MEK/1-methoxy-2-propanol (3/2 by weight) | 25 g |

The thus produced photosensitive printing plates were evaluated by the methods described below.

Each photosensitive printing plate was evaluated for sensitivity, gradation, and development latitude in the same manner as in the foregoing Examples 1A to 4A.

The obtained results are shown in Table 4B.

TABLE 3B

| | Fluorine-containing Polymer |
|---|---|
| Example 1B | $P_1$-16 |
| Example 2B | $P_1$-12 |
| Example 3B | $P_1$-15 |
| Comparative Example 1B | not added |
| Comparative Example 2B | R-7 |
| Comparative Example 3B | R-8 |

The amount added was 0.1 g on a solid basis.

TABLE 4B

| | Fluorine-containing Polymer | Sensitivity | Gradiation | Development Latitude |
|---|---|---|---|---|
| Example 1B | $P_1$-16 | 6.0 | 5.5 | 6 |
| Example 2B | $P_1$-12 | 6.0 | 5.0 | 5 |
| Example 3B | $P_1$-15 | 6.0 | 5.5 | 6 |
| Comparative Example 1B | not added | 6.0 | 6.5 | 8 |
| Comparative Example 2B | R-7 | 6.5 | 8.0 | 10 |
| Comparative Example 3B | R-8 | 6.0 | 6.5 | 8 |

It can be seen from Table 4B that Examples 1B to 3B exhibited high contrast and satisfactory development latitude without lowering the sensitivity.

EXAMPLES 4B TO 6B AND COMPARATIVE EXAMPLES 4B TO 6B

On the same substrate (I) as prepared in Examples 1B to 3B, each of the sensitizing solutions shown in Table 5B was coated by means of a rod coater to provide a coverage of 25 ml/m$^2$, and dried at 100° C. for 1 minute to obtain a positive working photosensitive printing plate. The dry coverage was 1.75 g/m$^2$. In order to reduce a vacuum contact time, the matte layer was formed thereon according to the description in JP-B-61-28986.

TABLE 5B

| [Sensitizing Solution] | |
|---|---|
| Esterification product of 1,2-diazonaphthoquinone-5-sulfonyl chloride and pyrogallol-acetone resin (described in Example 1 of U.S. Pat. No. 3,635,709) | 0.45 g |
| Cresol-formaldehyde novolak resin (meta/para ratio = 6/4; weight average molecular weight: 3,000; number average molecular weight: 1.100; unreacted cresol content: 0.7%) | 1.1 g |
| m-Cresol-formaldehyde novolak resin (weight average molecular weight: 1,700; number average molecular weight: 600; unreacted cresol content: 1%) | 0.3 g |
| Pyrogallol-acetone condensation product (weight average molecular weight: 2,200; number average molecular weight: 700) | 0.1 g |
| N-(p-Aminosulfonylphenyl)acrylamide/n-butyl-acrylate/diethylene glycol monomethylether-methacrylate (40:40:20 by mole) terpolymer (weight average molecular weight: 40,000; number average molecular weight: 20,000) | 0.2 g |
| p-n-Octylphenol-formaldehyde resin (described in U.S. Pat. No. 4,123,279) | 0.02 g |
| Naphthoquinone-1,2-diazido-4-sulfonic acid chloride | 0.01 g |
| Tetrahydrophthalic anhydride | 0.02 g |
| Benzoic acid | 0.02 g |
| Pyrogallol | 0.05 g |
| Dye of structural formula (A) shown above | 0.007 g |
| Triazine A | 0.01 g |
| N-(1,2-naphthoquinone-2-diazido-4-sulfonyloxy) cyclohexane-1,2-dicarboxylic acid imide | 0.01 g |
| Victoria Pure Blue BOH (product of Hodogaya Chemical Co., Ltd.) having the counter ion replaced by 1-naphthalene sulfonate ion | 0.045 g |
| 1-[α-Methyl-α-(4-hydroxy-3,5-dihydroxymethyl-phenyl)ethyl]-4-[α,α-bis(4-hydroxy-3,5-di-hydroxymethylphenyl)ethyl]benzene | 0.04 g |
| F176PF | 0.01 g |
| Fluorine-containing polymer (See Table 1B) | 0.1 g |
| Solvent (MEK/1-methoxy-2-propanol (3/2 by weight mixture) | 25 g |

Each of the photosensitive printing plates thus prepared each were exposed and developed in the same manner as in Examples 1A to 4A, and the sensitivity, the gradation and the development latitude of each plate were evaluated in the same manner as in Examples 1A to 4A. The obtained results are shown in Table 6B.

TABLE 6B

| | Fluorine-containing Polymer | Sensitivity | Gradiation | Development Latitude |
|---|---|---|---|---|
| Example 4B | $P_1$-16 | 5.0 | 4.5 | 4.5 |
| Example 5B | $P_1$-12 | 5.0 | 4.25 | 4.0 |
| Example 6B | $P_1$-15 | 5.0 | 4.5 | 4.5 |
| Comparative Example 4B | not added | 5.0 | 6.0 | 7 |
| Comparative Example 5B | R-7 | 5.5 | 8.0 | 9 |
| Comparative Example 6B | R-8 | 5.0 | 6.0 | 7 |

As can be seen from Table 6B, the photosensitive compositions prepared in Examples 4B to 6B according to the present invention were also successful in increasing the contrast and improving the development latitude without lowering the sensitivity.

EXAMPLES 7B TO 9B AND COMPARATIVE EXAMPLES 7B TO 9B

The surface of a 0.24 mm-thick aluminum plate (according to JIS A1050) was grained with a nylon brush and an aqueous suspension of 400 mesh pumice, and thoroughly rinsed with water. Then, the plate was etched by 60 seconds' immersion in a 10% aqueous NaOH kept at 70° C., and washed with running water. Further, the etched plate was rinsed with a 20% aqueous $HNO_3$ for neutralization, and washed with water. Then, the resulting plate underwent an electrolytic surface-roughening treatment using sine wave alternating current under a potential of 12.7 V in a quantity of electricity of 160 Coulomb/$dm^2$ at the anode in a 1% water solution of nitric acid. The surface roughness of the thus treated plate was measured, and the measured value thereof was 0.6 μm (expressed in Ra). Subsequently, the plate was desmutted by being immersed in a 30% aqueous solution of sulfuric acid for 2 minutes at 55° C. Thereafter, the plate was anodically oxidized in a 20% aqueous solution of sulfuric acid under the current density of 14 A/$dm^2$ till the oxidized film formed had a weight of the order of 2.5 g/$m^2$, followed by washing. Thus, a substrate [A] was prepared.

Further, the substrate [A] was treated with a 2.5% by weight of aqueous solution of sodium silicate for 20 seconds at 30° C., and then rinsed with water to obtain a substrate [B].

To the thus treated substrate [B], an undercoat solution (I) having the following composition was applied, and dried for 10 seconds at 70° C. The dry coverage of the undercoat was 15 mg/$m^2$.

| Undercoat Solution [I] | |
|---|---|
| Polyvinylbenzoic acid (Mw: 42,000) | 0.3 g |
| Methanol | 100 g |
| Water | 1 g |

On this support, each of the same photosensitive layers and the same matte layer as in Examples 1B to 3B were provided.

Each photosensitive printing plate was evaluated for sensitivity, gradation and development latitude in the same manner as in the foregoing Examples 1A to 4A expect that Developer A (having a pH of about 13.0) shown in Table 7B below was used as a developing solution.

TABLE 7B

| [Developer A] | |
|---|---|
| D-sorbitol | 5.1% by weight |
| Sodium hydroxide | 1.1% by weight |
| Triethanolamine-ethylene oxide adduct (30 moles) | 0.03% by weight |
| Water | 93.8% by weight |

The obtained results are shown in Table 8B.

TABLE 8B

| | Fluorine-containing Polymer | Sensitivity | Gradiation | Development Latitude |
|---|---|---|---|---|
| Example 7B | $P_1$-16 | 6.0 | 5.0 | 4.5 |
| Example 8B | $P_1$-12 | 6.0 | 4.75 | 4.38 |
| Example 9B | $P_1$-15 | 6.0 | 5.0 | 4.5 |
| Comparative Example 7B | not added | 6.0 | 6.0 | 7.0 |
| Comparative Example 8B | R-7 | 6.5 | 8.0 | 9.0 |

TABLE 8B-continued

| | Fluorine-containing Polymer | Sensitivity | Gradiation | Development Latitude |
|---|---|---|---|---|
| Comparative Example 9B | R-8 | 6.0 | 6.0 | 7.0 |

It can be seen from Table 8B that Examples 7B to 9B, in which the support and developer different from those used in the foregoing Examples were used, were also successful in increasing the contrast and improving the development latitude without lowering the sensitivity.

EXAMPLES 10B TO 12B AND COMPARATIVE EXAMPLE 10B

On the substrate which had undergone the same surface treatments, sodium silicate treatment and undercoat formation as adopted in Examples 7B to 9B, each of the same photosensitive layers and the same matte layer as in Examples 4B to 6B were provided.

Each of the photosensitive printing plates thus prepared was evaluated for the sensitivity, the gradation and the development latitude in the same manner as in Examples 7B to 9B. The obtained results are shown in Table 9B.

TABLE 9B

| | Fluorine-containing Polymer | Sensitivity | Gradiation | Development Latitude |
|---|---|---|---|---|
| Example 10B | $P_1$-16 | 5.0 | 4.25 | 4.25 |
| Example 11B | $P_1$-12 | 5.0 | 4.0 | 4.13 |
| Example 12B | $P_1$-15 | 5.0 | 4.25 | 4.25 |
| Comparative Example 10B | not added | 5.0 | 5.5 | 6.5 |

It can be seen from Table 9B that Examples 10B to 12B wherein the support and the developer used were different from those used in other Examples according to the present invention were also successful in increasing the contrast and improving the development latitude without lowering the sensitivity.

Next, the present invention is illustrated in more detail by reference to the following synthesis examples of a second fluorine-containing polymer and the following examples according to the embodiments using such second polymers.

Synthesis Example 1C

In a three-necked flask (300 ml), 15.5 g of 2-(perfluorooctyl)ethylacrylate, 9.56 g of N-(2-methylphenylsulfonyl)methacrylamide, 7.62 g of lauryl methacrylate and 63.14 g of tetrahydrofuran were placed, and kept at 65° C. with stirring in a stream of nitrogen. Thereto, 1.44 g 2,2'-azobis(2,4-dimethylvaleronitrile) was added, and the stirring was continued. After 4 hours, the temperature was raised to 68° C. and maintained for 1 hour. At the completion of the reaction, the reaction solution was cooled to room temperature, and then poured into 400 ml of methanol. The deposited solid was filtered off, and dried. The yield was 22.5 g, and the solid obtained was found to be a high-molecular compound having a weight average molecular weight of $2.3\times10^4$ by GPC. The polymer obtained was $P_2$-1 according to the present invention.

Synthesis Examples 2C to 5C

Polymers according to the present invention, $P_2$-2, $P_2$-3, $P_2$-4 and $P_2$-6, shown in Table 1C were each synthesized in the same manner as in Synthesis Example 1C.

Further, a comparative polymer R-9 shown in Table 1C was synthesized in the same manner as in Synthesis Example 1C.

TABLE 1C

| Synthesis Example | Polymer Name | Polymer Composition | | Weight Average Molecular weight |
|---|---|---|---|---|
| 1C | $P_2$-1 | | | 23,000 |
| 2C | $P_2$-2 | | | 21,000 |
| 3C | $P_2$-3 | | | 18,000 |
| 4C | $P_2$-4 | | | 30,000 |
| 5C | $P_2$-6 | | | 20,000 |
| Comparative 1C | R-9 | 2-(Perfluorooctyl)ethyl acrylate (0.05 mole) | N-(p-Aminosulfonylphenyl) methacrylamide (0.05 mole) | 25,000 |

EXAMPLES 1C TO 4C AND COMPARATIVE EXAMPLES 1C TO 2C

In the following examples and comparative examples, all percentages are by weight unless otherwise indicated.

The surface of a 0.24 mm-thick aluminum plate (according to JIS A 1050) was subjected to a brush graining treatment using a rotary nylon brush described below while supplying thereto an aqueous suspension of pumice having an average grain size of about 2.1 μm. The first brush had a bristle length of 100 mm, a bristle diameter of 0.95 mm and a setting density of 70 bristles/$cm^2$, and the second brush had a bristle length of 80 mm, a bristle diameter of 0.295 mm and a setting density of 670 bristles/$cm^2$. Each of the brush rolls was rotated at 250 r.p.m. Subsequently to the brush graining treatment, the aluminum plate was thoroughly rinsed with water. Further, the plate was etched by 25 seconds' immersion in a 10% sodium hydroxide at 60° C., and then washed with running water. Then, the etched plate was cleaned by neutralization with 20% nitric acid, and rinsed with water. Furthermore, the resultant plate was subjected to an electrolytic surface-roughening treatment using a sine-wave alternating electric current under a potential of 12.7 V in a quantity of electricity of 160 Coulomb/$dm^2$ at the anode in a 1% aqueous solution of nitric acid. The surface roughness of the thus treated plate was measured, and the measured value thereof was 0.79 μm (expressed in Ra). Subsequently, the plate was dipped in a 1% aqueous solution of sodium hydroxide for 30 seconds at 40° C., and then desmutted by being immersed in a 30% aqueous solution of sulfuric acid for 40 seconds at 60° C. Thereafter, the plate was anodically oxidized in a 20% aqueous solution of sulfuric acid by sending thereto a direct electric current at the current density of 2 A/$dm^2$ till the oxidized film formed had a weight of 1.6 g/$m^2$. Thus, a substrate was prepared.

To the surface of the thus treated substrate, the following undercoat solution (A) was applied, and dried at 80° C. for 30 seconds. The dry coverage of the undercoat was 10 mg/m².

| Undercoat Solution (A) | | |
|---|---|---|
| β-Alanine | 0.10 | g |
| Methanol | 40 | g |
| Purified water | 60 | g |

On the thus obtained substrate (I), each of the sensitizing solutions shown in Table 2C was coated by means of a rod coater to provide a coverage of 12 ml/m², and dried at 100° C. for 1 minute to obtain a positive working photosensitive printing plate. The dry coverage was 1.15 g/m². In order to reduce a vacuum contact time, the matte layer was formed thereon according to the description in JP-B-61-28986.

TABLE 2C

| [Sensitizing Solution] | | |
|---|---|---|
| Esterification product of 1,2-diazonaphtho-quinone-5-sulfonyl chloride and pyrogallol-acetone resin (described in Example 1 of U.S. Pat. No. 3,635,709) | 0.8 | g |
| Cresol-formaldehyde novolak resin (meta/para ratio = 6/4; weight average molecular weight: 8,000) | 1.5 | g |
| Phenol-formaldehyde novolak resin (weight average molecular weight: 15,000) | 0.3 | g |
| N-(P-Aminosulfonylphenyl)acrylamide/n-butyl-acrylate/diethylene glycol monomethylether-methacrylate (40:40:20 by mole) terpolymer (weight average molecular weight: 40,000; number average molecular weight: 20,000) | 0.2 | g |
| p-n-Octylphenol-formaldehyde resin (described in U.S. Pat. No. 4,123,279) | 0.02 | g |
| Naphthoquinone-1,2-diazido-4-sulfonic acid chloride | 0.01 | g |
| Tetrahydrophthalic anhydride | 0.02 | g |
| Benzoic acid | 0.02 | g |
| Pyrogallol | 0.05 | g |
| Triazine A | 0.07 | g |
| Victoria Pure Blue BOH (product of Hodogaya Chemical Co., Ltd.) having the counter ion replaced by 1-naphthalene sulfonate ion | 0.045 | g |
| F176PF | 0.01 | g |
| Fluorine-containing polymer (See Table 1C) | 0.1 | g |
| MEK/1-methoxy-2-propanol (3/2by weight) | 25 | g |

Each of the photosensitive printing plates thus prepared was evaluated for the sensitivity, the gradation and the development latitude in the same manner as in Examples 1A to 4A.

The obtained results are shown in Table 4C.

TABLE 3C

| | Fluorine-containing Polymer |
|---|---|
| Example 1C | P₂ - 1 |
| Example 2C | P₂ - 2 |
| Example 3C | P₂ - 3 |
| Example 4C | P₂ - 6 |
| Comparative Example 1C | not added |
| Comparative Example 2C | R - 9 |

The amount added was 0.1 g on a solid basis.

TABLE 4C

| | Fluorine-containing Polymer | Sensitivity | Gradation | Development Latitude |
|---|---|---|---|---|
| Example 1C | P₂-1 | 5.75 | 4.5 | 4 |
| Example 2C | P₂-2 | 5.75 | 4.5 | 4 |
| Example 3C | P₂-3 | 5.75 | 5.0 | 5 |
| Example 4C | P₂-6 | 6.0 | 6.0 | 7 |
| Comparative Example 1C | not added | 5.75 | 6.5 | 8 |
| Comparative Example 2C | R-9 | 6.0 | 7.5 | 9 |

It can be seen from Table 4C that Examples 1C to 4C exhibited high contrast and satisfactory development latitude without lowering the sensitivity.

EXAMPLES 5C TO 8C AND COMPARATIVE EXAMPLES 3C TO 4C

On the same substrate (I) as prepared in Examples 1C to 4C, each of the sensitizing solutions shown in Table 5C was coated by means of a rod coater to provide a coverage of 25 ml/m², and dried at 100° C. for 1 minute to obtain a positive working photosensitive printing plate. The dry coverage was 1.75 g/m². In order to reduce a vacuum contact time, the matte layer was formed thereon according to the description in JP-B-61-28986.

TABLE 5C

| Sensitizing Solution | |
|---|---|
| Esterification product of 1,2-diazonaphtho-quinone-5-sulfonyl chloride and pyrogallol-acetone resin (described in Example 1 of U.S. Pat. No. 3,635,709) | 0.45 g |
| Cresol-formaldehyde novolak resin (meta/para ratio = 6/4; weight average molecular weight: 3,000; number average molecular weight: 1.100; unreacted cresol content: 0.7%) | 1.3 g |
| m-Cresol-formaldehyde novolak resin (weight average molecular weight: 1,700; number average molecular weight: 600; unreacted cresol content: 1%) | 0.3 g |
| Pyrogallol-acetone condensation product (weight average molecular weight: 2,200; number average molecular weight: 700) | 0.1 g |
| N-(p-Aminosulfonylphenyl)acrylamide/n-butyl-acrylate/diethylene glycol monomethylether-methacrylate (40:40:20 by mole) terpolymer (weight average molecular weight: 40,000; number average molecular weight: 20,000) | 0.2 g |
| p-n-Octylphenol-formaldehyde resin (described in U.S. Pat. No. 4,123,279) | 0.02 g |
| Naphthoquinone-1,2-diazido-4-sulfonic acid chloride | 0.01 g |
| Tetrahydrophthalic anhydride | 0.02 g |
| Dye of structural formula (A) shown above | 0.007 g |
| Triazine A | 0.01 g |
| N-(1,2-naphthoquinone-2-diazido-4-sulfonyloxy)-cyclohexane-1,2-dicarboxylic acid imide | 0.01 g |
| Victoria Pure Blue BOH (product of Hodogaya Chemical Co., Ltd.) having the counter ion replaced by 1-naphthalene sulfonate ion | 0.045 g |
| 1-[α-Methyl-α-(4-hydroxy-3,5-dihydroxymethyl-phenyl)ethyl]-4-[α,α-bis(4-hydroxy-3,5-di-hydroxymethylphenyl)ethyl]benzene | 0.04 g |
| F176PF | 0.01 g |

TABLE 5C-continued

| Sensitizing Solution | |
|---|---|
| Fluorine-containing polymer (See Table 1C) | 0.1 g |
| Solvent (MEK/1-methoxy-2-propanol (3/2 by weight mixture) | 25 g |

The photosensitive printing plates thus prepared were each exposed and developed in the same manner as in Examples 1C to 4C, and the sensitivity, the gradation and the development latitude of each plate were evaluated by the same methods as adopted in Examples 1C to 4C. The obtained results are shown in Table 6C.

TABLE 6C

| | Fluorine-containing Polymer | Sensitivity | Gradation | Development Latitude |
|---|---|---|---|---|
| Example 5C | $P_2$-1 | 5.25 | 4.0 | 4 |
| Example 6C | $P_2$-2 | 5.25 | 4.0 | 4 |
| Example 7C | $P_2$-3 | 5.25 | 4.5 | 5 |
| Example 8C | $P_2$-6 | 5.5 | 5.5 | 6 |
| Comparative Example 3C | not added | 5.25 | 6.0 | 7 |
| Comparative Example 4C | R-9 | 5.5 | 7.0 | 8 |

As can be seen from Table 6C, the photosensitive compositions prepared in Examples 5C to 8C according to the present invention were also successful in increasing the contrast and improving the development latitude without lowering the sensitivity.

EXAMPLES 9C TO 12C AND COMPARATIVE EXAMPLE 5C

The surface of a 0.24 mm-thick aluminum plate (according to JIS A1050) was grained with a nylon brush and an aqueous suspension of 400 mesh pumice, and thoroughly rinsed with water. Then, the plate was etched by 60 seconds' immersion in a 10% aqueous NaOH kept at 70° C., and washed with running water. Further, the etched plate was cleaned by neutralization with a 20% aqueous $HNO_3$, and rinsed with water. Then, the resulting plate underwent an electrolytic surface-roughening treatment using sine wave alternating current under a potential of 12.7 V in a quantity of electricity of 160 Coulomb/$dm^2$ at the anode in a 1% water solution of nitric acid. The surface roughness of the thus treated plate was measured, and the measured value thereof was 0.6 $\mu$m (expressed in Ra). Subsequently, the plate was desmutted by being immersed in a 30% aqueous solution of sulfuric acid for 2 minutes at 55° C. Thereafter, the plate was anodically oxidized in a 20% aqueous solution of sulfuric acid under the current density of 14 A/$dm^2$ till the oxidized film formed had a weight of the order of 2.5 g/$m^2$, followed by washing. Thus, a substrate [A] was prepared.

Further, the substrate [A] was treated with a 2.5% by weight of aqueous solution of sodium silicate for 20 seconds at 30° C., and then rinsed with water to obtain a substrate [B].

To the thus treated substrate [B], an undercoat solution (I) having the following composition was applied, and dried for 10 seconds at 70° C. The dry coverage of the undercoat was 15 mg/$m^2$.

| Undercoat Solution [I] | |
|---|---|
| Polyvinylbenzoic acid (Mw: 42,000) | 0.3 g |
| Methanol | 100 g |
| Water | 1 g |

On this support were provided the same photosensitive layer as in Examples 1C to 4C, except that the fluorine-containing polymer was replaced by the polymer as shown in Table 8C, and the same matte layer as in Examples 1C to 4C.

Each photosensitive printing plate was evaluated for sensitivity, gradation and development latitude in the same manner as in the foregoing Examples 1A to 4A expect that Developer A (having a pH of about 13.0) shown in Table 7B was used as a developing solution.

The obtained results are shown in Table 7C.

TABLE 7C

| | Fluorine-containing Polymer | Sensitivity | Gradation | Development Latitude |
|---|---|---|---|---|
| Example 9C | $P_2$-3 | 5.75 | 5.0 | 5 |
| Example 10C | $P_2$-8 | 6.0 | 5.5 | 5 |
| Example 11C | $P_2$-11 | 6.0 | 4.5 | 4.38 |
| Example 12C | $P_2$-12 | 5.75 | 4.63 | 4.5 |
| Comparative Example 5C | not added | 5.75 | 6.0 | 7.0 |

As can be seen from Table 7C, Examples 9C to 12C wherein the support and the developer used were different from those used in other Examples according to the present invention were also successful in increasing the contrast and improving the development latitude without lowering the sensitivity.

EXAMPLES 13C TO 16C AND COMPARATIVE EXAMPLE 6C

On the substrate which had undergone the same surface treatments, sodium silicate treatment and undercoat formation as adopted in Examples 9C to 12C, the same photosensitive layer as in Examples 5C to 8C, except that the fluorine-containing polymer was replaced by the polymer as shown in Table 9C, and the same matte layer as in Examples 5C to 8C were provided.

The photosensitive printing plates thus prepared were evaluated for the sensitivity, the gradation and the development latitude in the same manner as in Examples 9C to 12C. The obtained results are shown in Table 8C.

TABLE 8C

| | Fluorine-containing Polymer | Sensitivity | Gradation | Development Latitude |
|---|---|---|---|---|
| Example 13C | $P_2$-2 | 5.0 | 4.25 | 4.0 |
| Example 14C | $P_2$-5 | 5.0 | 4.75 | 4.0 |
| Example 15C | $P_2$-9 | 4.75 | 4.0 | 4.5 |
| Example 16C | $P_2$-10 | 5.25 | 3.8 | 4.0 |

TABLE 8C-continued

| | Fluorine-containing Polymer | Sensitivity | Gradation | Development Latitude |
|---|---|---|---|---|
| Comparative Example 6C | not added | 5.0 | 5.5 | 6.5 |

As can be seen from Table 8C, Examples 13C to 16C wherein the support and the developer used were different from those used in other Examples according to the present invention were also successful in increasing the contrast and improving the development latitude without lowering the sensitivity.

Further, the present invention is illustrated in more detail by reference to the following synthesis examples of a third fluorine-containing polymer and the following examples according to the embodiments using such third polymers.

Synthesis Example 1D

In a three-necked round bottom flask (500 ml) equipped with a condenser and a stirrer, 0.1 mole of 2,4-tolylenediisocyanate, 0.03 mole of perfluorooctanesulfonic acid diethanolamide, 0.02 mole of 1,10-decanediol and 0.05 mole of the compound shown as Exemplified Compound UM-11 were placed. These ingredients were admixed with 400 ml of dioxane to be dissolved therein. Thereto, 0.5 g of di-n-butyltin was added as a catalyst. The resultant mixture was heated with stirring under reflux for 6 hours. Thereafter, the reaction solution was poured into 4 l of water to deposit a solid. The solid was filtered off, and dried. The solid obtained was the intended polymer UP-5, and the weight average molecular weight thereof was found to be $2.8\times10^4$ by GPC.

Synthesis Examples 2D to 4D

Polymers according to the present invention, UP-6, UP-8 and UP-9, shown in Table 1D were each synthesized in the same manner as in Synthesis Example 1D.

Further, comparative polymers UR-1 and UR-2 shown in Table 1D was synthesized in the same manner as in Synthesis Example 1D.

The surface of a 0.24 mm-thick aluminum plate (according to JIS A 1050) was subjected to a brush graining treatment using a rotary nylon brush described below while supplying thereto an aqueous suspension of pumice having an average grain size of about 2.1 μm. The first brush had a bristle length of 100 mm, a bristle diameter of 0.95 mm and a setting density of 70 bristles/cm$^2$, and the second brush had a bristle length of 80 mm, a bristle diameter of 0.295 mm and a setting density of 670 bristles/cm$^2$. Each of the brush rolls was rotated at 250 r.p.m. Subsequently to the brush graining treatment, the aluminum plate was thoroughly rinsed with water. Further, the plate was etched by 25 seconds' immersion in a 10% sodium hydroxide at 60° C., and then washed with running water. Then, the etched plate was cleaned by neutralization with 20% nitric acid, and rinsed with water. Furthermore, the resultant plate was subjected to an electrolytic surface-roughening treatment using a sine-wave alternating electric current under a potential of 12.7 V in a quantity of electricity of 160 Coulomb/dm$^2$ at the anode in a 1% aqueous solution of nitric acid. The surface roughness of the thus treated plate was measured, and the measured value thereof was 0.79 μm (expressed in Ra). Subsequently, the plate was dipped in a 1% aqueous solution of sodium hydroxide for 30 seconds at 40° C., and then desmutted by being immersed in a 30% aqueous solution of sulfuric acid for 40 seconds at 60° C. Thereafter, the plate was anodically oxidized in a 20% aqueous solution of sulfuric acid by sending thereto a direct electric current at the current density of 2 A/dm$^2$ till the oxidized film formed had a weight of 1.6 g/m$^2$. Thus, a substrate was prepared.

To the surface of the thus treated substrate, the following undercoat solution (A) was applied, and dried at 80° C. for 30 seconds. The dry coverage of the undercoat was 10 mg/m$^2$.

| Undercoat Solution (A) | | |
|---|---|---|
| β-Alanine | 0.10 | g |
| Methanol | 40 | g |
| Purified water | 60 | g |

On the thus obtained substrate (I), each of the sensitizing solutions shown in Table 2D was coated by means of a rod coater to provide a coverage of 12 ml/m$^2$, and dried at 100° C. for 1 minute to obtain a positive working photosensitive printing plate. The dry coverage was 1.03 g/m$^2$. In order to reduce a vacuum contact time, the matte layer was formed thereon according to the description in JP-B-61-28986.

TABLE 1D

| Synthesis Example | Polymer Name | Polymer Composition | | | | Weight Average Molecular weight |
|---|---|---|---|---|---|---|
| 1D | UP-5 | | | | | 28,000 |
| 2D | UP-6 | | | | | 28,000 |
| 3D | UP-8 | | | | | 21.000 |
| 4D | UP-9 | | | | | 19,000 |
| Comparative 1D | UR-1 | 2,4-Tolylene diisocyanate (0.1 mole) | Perfluorooctane-sulfonic acid diethanolamide (0.05 mole) | | UM-11 (0.05 mole) | 21,000 |
| Comparative 2D | UR-2 | 2,4-Tolylene diisocyanate (0.1 mole) | Perfluorooctane-sulfonic acid diethanolamide (0.03 mole) | 1,10-decane diol (0.03 mole) | 2,2-bis(hydroxy methyl)propionate (0.04 mole) | 20,500 |

EXAMPLES 1D TO 4D AND COMPARATIVE EXAMPLES 1D TO 3D

In the following examples and comparative examples, all percentages are by weight unless otherwise indicated.

TABLE 2D

| [Sensitizing Solution] | | |
|---|---|---|
| Esterification product of 1,2-diazonaphtho-quinone-5-sulfonyl chloride and pyrogallol-acetone resin (described in Example 1 of U.S. Pat. No. 3,635,709) | 0.8 | g |
| Cresol-formaldehyde novolak resin (meta/para ratio = 6/4; weight average molecular weight: 8,000) | 1.5 | g |
| Phenol-formaldehyde novolak resin (weight average molecular weight: 15,000) | 0.2 | g |
| N-(p-Aminosulfonylphenyl)acrylamide/n-butyl acrylate/diethylene glycol monomethylether methacrylate (40:40:20 by mole) terpolymer (weight average molecular weight: 40,000); number average molecular weight: 20,000) | 0.2 | g |
| p-n-Octylphenol-formaldehyde resin (described in U.S. Pat. No. 4,123,279) | 0.02 | g |
| Naphthoquinone-1,2-diazido-4-sulfonic acid chloride | 0.02 | g |
| Tetrahydrophthalic anhydride | 0.16 | g |
| Triazine A | 0.07 | g |
| Victoria Pure Blue BOH (product of Hodogaya Chemical Co., Ltd.) having the counter ion replaced by 1-naphthalene sulfonate ion | 0.045 | g |
| F176PF | 0.01 | g |
| Fluorine-containing polymer (See Table 3D) | 0.08 | g |
| MEK/1-methoxy-2-propanol (13/12by weight) | 25 | g |

Each of the thus-prepared photosensitive printing plates was evaluated for sensitivity, gradation and development latitude in the same manner as in the foregoing Examples 1A to 4A.

The obtained results are shown in Table 4D.

TABLE 3D

| | Fluorine-containing Polymer |
|---|---|
| Example 1D | UP - 5 |
| Example 2D | UP - 6 |
| Example 3D | UP - 8 |
| Example 4D | UP - 9 |
| Comparative Example 1D | not added |
| Comparative Example 2D | UR - 1 |
| Comparative Example 3D | UR - 2 |

The amount added was 0.08 g on a solid basis.

TABLE 4D

| | Fluorine-containing Polymer | Sensitivity | Gradation | Development Latitude |
|---|---|---|---|---|
| Example 1D | UP-5 | 6.0 | 5.25 | 5 |
| Example 2D | UP-6 | 6.0 | 5.0 | 5 |
| Example 3D | UP-8 | 5.75 | 5.5 | 5.5 |
| Example 4D | UP-9 | 6.05 | 5.25 | 5 |
| Comparative Example 1D | not added | 6.0 | 6.5 | 8 |
| Comparative Example 2D | UR-1 | 6.5 | 8.0 | 10 |
| Comparative Example 3D | UR-2 | 6.0 | 6.5 | 8 |

It can be seen from Table 4D that Examples 1D to 4D exhibited high contrast and satisfactory development latitude without lowering the sensitivity.

EXAMPLES 5D TO 8D AND COMPARATIVE EXAMPLES 4D TO 6D

On the same substrate (I) as prepared in Examples 1D to 4D, each of the sensitizing solutions shown in Table 5D was coated by means of a rod coater to provide a coverage of 25 ml/$m^2$, and dried at 100° C. for 1 minute to obtain a positive working photosensitive printing plate. The dry coverage was 1.75 g/$m^2$. In order to reduce a vacuum contact time, the matte layer was formed thereon according to the description in JP-B-61-28986.

TABLE 5D

| [Sensitizing Solution] | | |
|---|---|---|
| Esterification product of 1,2-diazonaphtho-quinone-5-sulfonyl chloride and pyrogallol-acetone resin (described in Example 1 of U.S. Pat. No. 3,635,709) | 0.55 | g |
| Cresol-formaldehyde novolak resin (meta/para ratio = 6/4; weight average molecular weight: 3,000; number average molecular weight: 1,100; unreacted cresol content: 0.7%) | 1.2 | g |
| m-Cresol-formaldehyde novolak resin (weight average molecular weight: 1,700; number average molecular weight: 600; unreacted cresol content: 1%) | 0.4 | g |
| Pyrogallol-acetone condensation product (weight average molecular weight: 2,200; number average molecular weight: 700) | 0.2 | g |
| p-n-octylphenol-formaldehyde resin (described in U.S. Pat. No. 4,123,279) | 0.03 | g |
| Naphthoquinone-1,2-diazido-4-sulfonic acid chloride | 0.01 | g |
| Tetrahydrophthalic anhydride | 0.02 | g |
| Benzoic acid | 0.02 | g |
| Pyrogallol | 0.05 | g |
| Dye of structural formula (A) shown above | 0.007 | g |
| Triazine A | 0.01 | g |
| N-(1,2-naphthoquinone-2-diazido-4-sulfonyloxy)-cyclohexane-1,2-dicarboxylic acid imide | 0.01 | g |
| Victoria Pure Blue BCH (product of Hodogaya Chemical Co., Ltd.) having the counter ion replaced by 1-naphthalene sulfonate ion | 0.045 | g |
| 1-[α-Methyl-α-(4-hydroxy-3,5-dihydroxymethyl-phenyl)ethyl]-4-[α,α-bis(4-hydroxy-3,5-di-hydroxymethylphenyl)ethyl]benzene | 0.04 | g |
| F176PF | 0.01 | g |
| Fluorine-containing polymer (See Table 6D) | 0.08 | g |
| Solvent (MEK/1-methoxy-2-propanol (3/2by weight mixture) | 25 | g |

Each of the thus-prepared photosensitive printing plates was evaluated for sensitivity, gradation and development latitude in the same manner as in the foregoing Examples 1D to 4D. The obtained results are shown in Table 6D.

TABLE 6D

| | Fluorine-containing Polymer | Sensitivity | Gradation | Development Latitude |
|---|---|---|---|---|
| Example 5D | UP-5 | 5.5 | 4.3 | 4.5 |
| Example 6D | UP-6 | 5.5 | 4.5 | 4.5 |
| Example 7D | UP-8 | 5.0 | 4.7 | 4.5 |
| Example 8D | UP-9 | 5.5 | 4.8 | 4.5 |
| Comparative Example 4D | not added | 5.5 | 5.5 | 7 |
| Comparative Example 5D | UR-1 | 6.0 | 6.5 | 8 |
| Comparative Example 6D | UR-2 | 6.0 | 6.5 | 8 |

It can be seen from Table 6D that the photosensitive compositions prepared in Examples 5D to 8D according to the present invention were also successful in increasing the contrast and improving the development latitude without lowering the sensitivity.

EXAMPLES 9D TO 11C AND COMPARATIVE EXAMPLE 7D

The surface of a 0.24 mm-thick aluminum plate (according to JIS A1050) was grained with a nylon brush and an aqueous suspension of 400 mesh pumice, and thoroughly rinsed with water. Then, the plate was etched by 60 seconds' immersion in a 10% aqueous NaOH kept at 70° C., and washed with running water. Further, the etched plate was cleaned by neutralization with a 20% aqueous $HNO_3$, and rinsed with water. Then, the resulting plate underwent an electrolytic surface-roughening treatment using sine wave alternating current under a potential of 12.7 V in a quantity of electricity of 160 Coulomb/$dm^2$ at the anode in a 1% water solution of nitric acid. The surface roughness of the thus treated plate was measured, and the measured value thereof was 0.6 $\mu$m (expressed in Ra). Subsequently, the plate was desmutted by being immersed in a 30% aqueous solution of sulfuric acid for 2 minutes at 55° C. Thereafter, the plate was anodically oxidized in a 20% aqueous solution of sulfuric acid under the current density of 14 A/$dm^2$ till the oxidized film formed had a weight of the order of 2.5 g/$m^2$, followed by washing. Thus, a substrate [A] was prepared.

Further, the substrate [A] was treated with a 2.5% by weight of aqueous solution of sodium silicate for 20 seconds at 30° C., and then rinsed with water to obtain a substrate [B].

To the thus treated substrate [B], an undercoat solution (I) having the following composition was applied, and dried for 10 seconds at 70° C. The dry coverage of the undercoat was 15 mg/$m^2$.

| Undercoat Solution [I] | | |
|---|---|---|
| Polyvinylbenzoic acid (Mw: 42,000) | 0.3 | g |
| Methanol | 100 | g |
| Water | 1 | g |

On this support were provided the same photosensitive layer, except that the fluorine-containing polymer was replaced by the polymer as shown in Table 8D, and the same matte layer as in Examples 1D to 4D.

Each photosensitive printing plate was evaluated for sensitivity, gradation and development latitude in the same manner as in the foregoing Examples 1A to 4A expect that Developer A (having a pH of about 13.0) shown in Table 7B was used as a developing solution.

The obtained results are shown in Table 7D below.

TABLE 7D

| | Fluorine-containing Polymer | Sensitivity | Gradation | Development Latitude |
|---|---|---|---|---|
| Example 9D | UP-7 | 6.3 | 5.0 | 4.0 |
| Example 10D | UP-10 | 6.3 | 5.0 | 4.5 |
| Example 11D | UP-11 | 6.0 | 4.5 | 4.5 |
| Comparative Example 7D | not added | 6.3 | 6.0 | 7.0 |

It can be seem from Table 7D that Examples 9D to 11D wherein the support and the developer used were different from those used in other Examples were also successful in increasing the contrast and improving the development latitude without lowering the sensitivity.

As demonstrated above, positive working photosensitive compositions containing the particular fluorine-containing polymers according to the present invention can ensure high contrast image formation without lowering the sensitivity, and further make it possible to prevent a halation from generating upon printing and provide satisfactory safe light tolerance and development latitude.

What is claimed is:

1. A positive working photosensitive composition comprising a photosensitive component and a fluorine-containing copolymer; said copolymer having at least the following constitutional components (1), (2) and (3) as copolymerization components:

(1) an addition polymerizable monomer having a fluoro-aliphatic group, (2) an acrylate, methacrylate, acrylamide or methacrylamide, each having an aliphatic group having at least 9 carbon atoms or an aromatic group substituted by an aliphatic group containing at least two carbon atoms, and (3) an addition polymerizable monomer which has an acidic group in which the acidic hydrogen atom is bonded to a nitrogen atom, or a monomer having a phenolic hydroxyl group represented by the following formula [1], [2] or [3]:

$$CH_2{=}CA[CO{-}NR_1{-}(X)_m{-}Y{-}(OH)_n] \quad [1]$$

$$CH_2{=}CA[CO{-}O{-}(X)_m{-}Y{-}(OH)_n] \quad [2]$$

$$CH_2{=}CA[Z{-}(X){-}Y{-}(OH)_n] \quad [3]$$

wherein A represents a hydrogen atom, a halogen atom or an alkyl group having 1 to 4 carbon atoms; $R_1$ represents a hydrogen atom, an alkyl group having 1 to 20 carbon atoms or an aryl group having 6 to 20 carbon atoms; Y and Z, which may be the same or different, each represents an arylene group having 6 to 20 carbon atoms; X is a divalent organic linkage group composed of atoms selected from carbon, nitrogen, oxygen, sulfur, halogen and hydrogen atoms; m is an integer of 0 or 1; and n is an integer of 1 to 3.

2. The positive working photosensitive composition of claim 1, wherein the addition polymerizable monomer having an acidic group whose acidic hydrogen atom is bonded to a nitrogen atom as component (3) is a monomer having the structural unit of formula (4-1), (4-2) or (4-3):

$$CH_2{=}CA[(B)_m{-}(X)_n{-}NH{-}Y] \quad (4\text{-}1)$$

$$CH_2{=}CA[CO{-}Z{-}E{-}SO_2NH{-}R_2] \quad (4\text{-}2)$$

wherein A is a hydrogen atom, a halogen atom or an alkyl group having 1 to 4 carbon atoms; B is an arylene group; X is —CO— or —$SO_2$—; when X is —$SO_2$—, Y is a hydrogen atom, an alkyl group, an aryl group, —CO—$R_1$ or —$SO_2$—$R_1$, and when X is —CO—, Y is —CO—$R_1$ or —$SO_2$—$R_1$; Z is —NH—, —$NR_1$— or —O—; E is an arylene group or an alkylene group; $R_2$ is a hydrogen atom, an alkyl group or an aryl group; m and n is each 0 or 1, with the proviso that m and n are not zero at the same time; $R_1$ is an alkyl group or an aryl group; and B and Y, or E and $R_2$ may combine with each other to form a ring composed of non-metallic atoms;

(4-3)

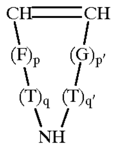

wherein F and G each are a phenylene group or an alkylene group; T is —O—CO—, —CO— or $—SO_2—$; and p, p', q and q' each are 0 or 1, with the proviso that q and q' are not zero at the same time.

3. A positive working photosensitive composition comprising a photosensitive component and a fluorine-containing copolymer; said copolymer having at least the following constitutional units (1) and (2) as copolymerization components:

(1) an addition polymerizable monomer having a fluoroaliphatic group, and (2) a monomer having a constitutional unit represented by the following formula (2-1), (2-2) or (2-3);

$CH_2{=}CA[(B)_m{—}CONH{—}SO_2R^1]$ (2-1)

$CH_2{=}CA[(B)_m{—}SO_2{—}NH{—}Y]$ (2-2)

(2-3)

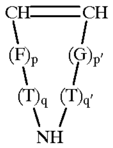

wherein A represents a hydrogen atom, a halogen atom or an alkyl group; B represents an arylene group; m is 0 or 1; $R^1$ represents an alkyl group or an aryl group; Y represents a hydrogen atom, an alkyl group, an aryl group, $—CO—R^2$ or $—SO_2—R^2$; $R^2$ represents an alkyl group or an aryl group; or B may combine with Y or $R^1$ to form a ring composed of non-metallic atoms; F and G each represent a phenylene group or an alkylene group; T represents —O—CO—, —CO— or $—SO_2—$; p, p', q and q' each are 0 or 1, with the proviso that q and q' are not zero at the same time.

* * * * *